(12) United States Patent
Park et al.

(10) Patent No.: US 12,733,390 B2
(45) Date of Patent: Sep. 8, 2026

(54) LIGHT-EMITTING DEVICE AND DISPLAY APPARATUS INCLUDING THE SAME

(71) Applicant: Samsung Display Co., Ltd., Yongin-si (KR)

(72) Inventors: Heungsu Park, Anyang-si (KR); Songeun Lee, Hwaseong-si (KR); Namsu Kang, Seoul (KR); Jongwon Lee, Yongin-si (KR); Hyunshik Lee, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 935 days.

(21) Appl. No.: 17/704,679

(22) Filed: Mar. 25, 2022

(65) Prior Publication Data

US 2023/0016588 A1 Jan. 19, 2023

(30) Foreign Application Priority Data

Jun. 29, 2021 (KR) ........................ 10-2021-0085128

(51) Int. Cl.
*H10K 85/30* (2023.01)
*H10K 50/11* (2023.01)
(Continued)

(52) U.S. Cl.
CPC ......... *H10K 85/346* (2023.02); *H10K 85/342* (2023.02); *H10K 50/11* (2023.02);
(Continued)

(58) Field of Classification Search
CPC ............................ H10K 59/352; H10K 50/13
See application file for complete search history.

(56) References Cited

U.S. PATENT DOCUMENTS 6,107,734 A 8/2000 Tanaka et al.
6,847,162 B2 1/2005 Duggal et al.
(Continued)

FOREIGN PATENT DOCUMENTS

JP 11-329748 11/1999
JP 2003-272860 9/2003
(Continued)

*Primary Examiner* — Sean M DeGuire
(74) *Attorney, Agent, or Firm* — Womble Bond Dickinson (US) LLP

(57) ABSTRACT

A light-emitting device including a first electrode, a hole transport region disposed on the first electrode, a first light-emitting layer disposed on the hole transport region and emitting light of a first wavelength, a second light-emitting layer disposed on the hole transport region and emitting light of a second wavelength different from the first wavelength, an electron transport region disposed on the first light-emitting layer and the second light-emitting layer, and a second electrode disposed on the electron transport region, wherein the second light-emitting layer includes a first sub light-emitting layer including a first host and a first dopant and emitting the light of the second wavelength, and a second sub light-emitting layer including a second host different from the first host and a second dopant and emitting the light of the second wavelength. Accordingly, a luminous efficiency and device lifetime of the light-emitting device may be improved.

17 Claims, 10 Drawing Sheets

(51) Int. Cl.

| | |
|---|---|
| ***H10K 50/15*** | (2023.01) |
| ***H10K 50/16*** | (2023.01) |
| ***H10K 50/17*** | (2023.01) |
| ***H10K 101/30*** | (2023.01) |
| ***H10K 101/40*** | (2023.01) |

(52) U.S. Cl.

CPC ............. *H10K 50/15* (2023.02); *H10K 50/16* (2023.02); *H10K 50/171* (2023.02); *H10K 2101/30* (2023.02); *H10K 2101/40* (2023.02)

(56) References Cited

U.S. PATENT DOCUMENTS 6,872,472 B2 3/2005 Liao et al.
7,906,897 B2 3/2011 Satou
8,217,392 B2 7/2012 Kitamura
8,841,653 B2 9/2014 Shitagaki et al.
9,070,892 B2 6/2015 Kido
9,722,189 B2 8/2017 Tada
9,876,187 B2 1/2018 Shitagaki et al.
10,056,571 B2 8/2018 Han et al.
10,290,826 B2 5/2019 Kim et al.
10,692,417 B2 6/2020 Lee et al.
11,056,653 B2 7/2021 Yokoyama et al.
11,081,532 B2 8/2021 Lee et al.
11,552,259 B1 1/2023 Tasaki et al.
12,219,872 B2 2/2025 Hirayama et al.
2006/0073359 A1* 4/2006 Ise ........................ H10K 50/11 428/690
2008/0187748 A1 8/2008 Mishima
2010/0044695 A1* 2/2010 Kai ...................... H10K 85/636 544/212
2016/0064682 A1* 3/2016 Yamae .................. H10K 50/13 257/40
2019/0179065 A1* 6/2019 Kim ...................... G02B 5/201
2019/0211219 A1* 7/2019 Kondo .................. C09K 11/06
2020/0358018 A1 11/2020 Kim et al.
2020/0381484 A1 12/2020 Choe
2021/0151691 A1 5/2021 Yoon et al.
2022/0119360 A1 4/2022 Mochizuki et al.

FOREIGN PATENT DOCUMENTS

JP 2004-39617 2/2004
JP 2004327443 A 11/2004
JP 2006093542 A 4/2006
JP 2009099967 A 5/2009
JP 2011009729 A 1/2011
JP 2011071452 A 4/2011
JP 2012079898 A 4/2012
JP 5205584 6/2013
JP 5300255 9/2013
JP 5610848 10/2014
JP 6107657 4/2017
JP 2020109757 A 7/2020
KR 10-2014-0059713 5/2014
KR 10-2017-0031362 A 3/2017
KR 10-2017-0061522 A 6/2017
KR 10-2017-0080287 A 7/2017
KR 10-2019-0000759 1/2019
KR 10-2020-0129210 11/2020
KR 10-2021-0059153 5/2021
WO 2010140549 A1 12/2010
WO 2014168138 A1 10/2014
WO 2017183625 A1 10/2017
WO 2020137724 A1 7/2020
WO 2020171221 A1 8/2020
WO 2021162057 A1 8/2021

* cited by examiner

LIGHT-EMITTING DEVICE AND DISPLAY APPARATUS INCLUDING THE SAME

CROSS REFERENCE TO RELATED APPLICATION(S)

This U.S. non-provisional patent application claims priority to and benefits of Korean Patent Application No. 10-2021-0085128 under 35 U.S.C. § 119, filed on Jun. 29, 2021 in the Korean Intellectual Property Office, the entire contents of which are incorporated herein by reference.

BACKGROUND

1. Technical Field

The disclosure herein relates to a light-emitting device with improved luminous efficiency and device lifetime and a display apparatus including the same.

2. Discussion of the Related Art

An organic light-emitting device may be a self-luminescent device which has a high response speed and that may be driven at a low voltage. Accordingly, an organic light-emitting display apparatus including the organic light-emitting device has various advantages including that a separate light source may not be required such that weight and thickness may be reduced, that luminance is good, and that there may be no viewing angle issues.

The organic light-emitting device may be a display device having a light-emitting layer made of an organic material between an anode electrode and a cathode electrode. Holes provided from the anode electrode and electrons provided from the cathode electrode may be combined in the light-emitting layer to form excitons, and light that corresponds to energy between the holes and the electrons may be generated from the excitons.

A tandem organic light-emitting device may have a structure including stacks, for example, at least two stacks, of hole transport layer/light-emitting layer/electron transport layer. The stacks may be formed between an anode electrode and a cathode electrode and a charge generation layer that helps the generation and movement of charges exists between the stacks.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light-emitting device with improved luminous efficiency and device lifetime.

The disclosure also provides a display apparatus with improved display efficiency.

In an embodiment, a light-emitting device may include a first electrode, a hole transport region disposed on the first electrode, a first light-emitting layer disposed on the hole transport region and emitting light of a first wavelength, a second light-emitting layer disposed on the hole transport region and emitting light of a second wavelength different from the first wavelength, an electron transport region disposed on the first light-emitting layer and the second light-emitting layer, and a second electrode disposed on the electron transport region, wherein the second light-emitting layer may include a first sub light-emitting layer including a first host and a first dopant and emitting the light of the second wavelength, and a second sub light-emitting layer including a second host different from the first host and a second dopant and emitting the light of the second wavelength.

In an embodiment, the first wavelength may be about 420 nm to about 480 nm, and the second wavelength may be about 520 nm to about 600 nm.

In an embodiment, a difference in highest occupied molecular orbital (HOMO) energy level between the first host and the first dopant may be about 0.2 eV or less, and a difference in HOMO energy level between the second host and the second dopant may be about 0.1 eV or more.

In an embodiment, the light-emitting device may include a charge generation layer disposed between the first light-emitting layer and the second light-emitting layer.

In an embodiment, the charge generation layer may include a p-type charge generation layer doped with p-dopants, and an n-type charge generation layer doped with n-dopants.

In an embodiment, the light-emitting device may further include a first additional light-emitting layer disposed between the hole transport region and the electron transport region and emitting the light of the first wavelength.

In an embodiment, the light-emitting device may further include a second additional light-emitting layer disposed between the first light-emitting layer and the second light-emitting layer and emitting the light of the first wavelength.

In an embodiment, the first dopant may include an organometallic compound having a central metal of platinum (Pt).

In an embodiment, the first dopant may be represented by Formula M-a below:

[Formula M-a]

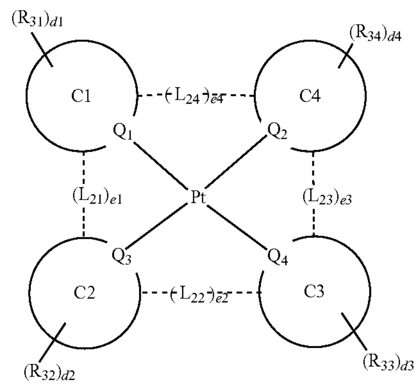

in Formula M-a, $Q_1$ to $Q_4$ are each independently C or N, rings C1 to C4 are each independently a substituted or unsubstituted hydrocarbon ring having 5 to 30 ring-forming carbon atoms or a substituted or unsubstituted heterocycle having 2 to 30 ring-forming carbon atoms, $L_{21}$ to $L_{24}$ are each independently a direct linkage,

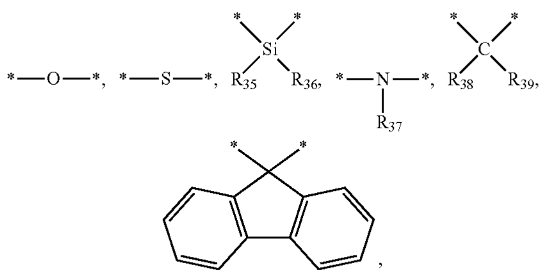

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, e1 to e4 are each independently 0 or 1, $R_{31}$ to $R_{39}$ are each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, and d1 to d4 are each independently an integer of 0 to 4.

In an embodiment, the second dopant may include an organometallic compound having a central metal of iridium (Ir).

In an embodiment, the second dopant may be represented by Formula M-b:

[Formula M-b]

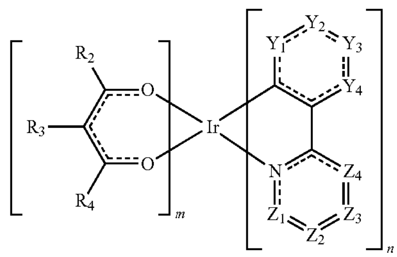

in Formula M-b, $Y_1$ to $Y_4$, and $Z_1$ to $Z_4$ are each independently $CR_1$ or N, $R_1$ to $R_4$ are each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, and m is 0 or 1, n is 2 or 3, where in case that m is 0, n is 3, and in case that m is 1, n is 2.

In an embodiment, the hole transport region may include a hole injection layer disposed on the first electrode, and a hole transport layer disposed on the hole injection layer, and the electron transport region may include an electron transport layer disposed on the first light-emitting layer and the second light-emitting layer, and an electron injection layer disposed on the electron transport layer.

In an embodiment, the light-emitting device may further include a capping layer disposed on the second electrode, wherein the capping layer has a refractive index of about 1.6 or more.

In an embodiment, the first sub light-emitting layer and the second sub light-emitting layer may contact each other.

In an embodiment, the light-emitting device may further include an intermediate electron transport layer disposed between the first light-emitting layer and the charge generation layer, and an intermediate hole transport layer disposed between the charge generation layer and the second light-emitting layer.

In an embodiment, a display apparatus may include a display panel including a first pixel region emitting light of a first wavelength, a second pixel region emitting light of a second wavelength different from the first wavelength, a third pixel region emitting light of a third wavelength different from the first wavelength and the second wavelength, and a light-emitting device overlapping the first to third pixel regions in a plan view, and a light control layer including a first light control part disposed on the display panel and overlapping the first pixel region in a plan view, a second light control part overlapping the second pixel region in a plan view, and a third light control part overlapping the third pixel region in a plan view, wherein the light-emitting device may include a first electrode, a hole transport region disposed on the first electrode, a first light-emitting layer disposed on the hole transport region and emitting the light of the first wavelength, a second light-emitting layer disposed on the hole transport region and emitting the light of the second wavelength, an electron transport region disposed on the first light-emitting layer and the second light-emitting layer, and a second electrode disposed on the electron transport region, the second light-emitting layer may include a first sub light-emitting layer including a first host and a first dopant and emits the light of the second wavelength, and a second sub light-emitting layer includes a second host different from the first host and a second dopant and emits the light of the second wavelength.

In an embodiment, the first wavelength may be about 420 nm to about 480 nm, and the second wavelength may be about 520 nm to about 600 nm.

In an embodiment, a difference in highest occupied molecular orbital (HOMO) energy level between the first host and the first dopant may be about 0.2 eV or less, and a difference in HOMO energy level between the second host and the second dopant may be about 0.1 eV or more.

In an embodiment, the second light control part may include quantum dots that convert the light of the first wavelength into the light of the second wavelength, and the third light control part may include quantum dots that convert light of the first wavelength or light of the second wavelength into the light of the third wavelength.

In an embodiment, the display apparatus may further include a color filter layer disposed on the light control layer.

BRIEF DESCRIPTION OF THE DRAWINGS

The accompanying drawings are included to provide a further understanding of the disclosure, and are incorporated in and constitute a part of this specification. The drawings illustrate embodiments and, together with the description, serve to explain principles of the disclosure. In the drawings.

DETAILED DESCRIPTION OF THE EMBODIMENTS

Figure 1:
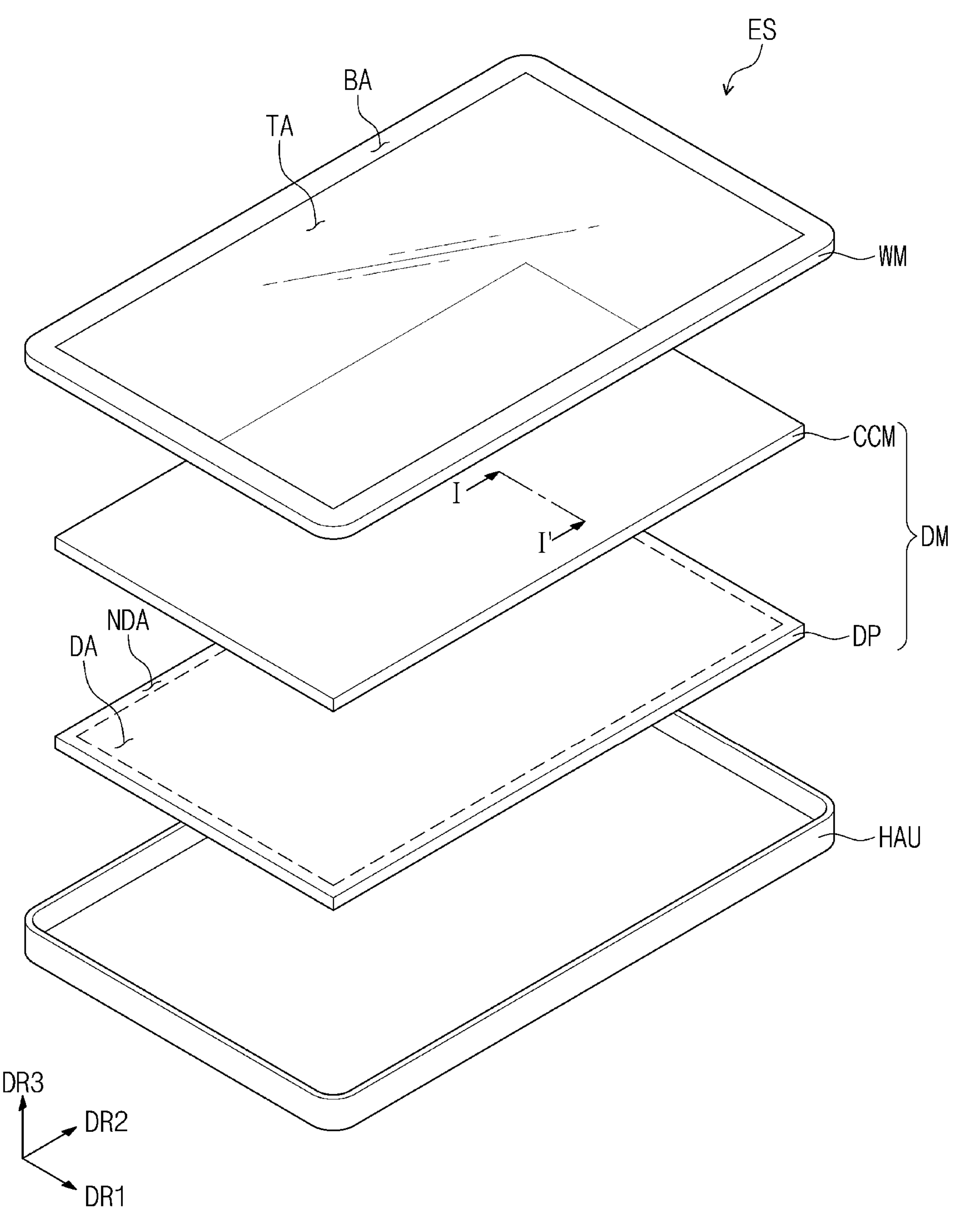
FIG. 1 is an exploded schematic perspective view of a display apparatus according to an embodiment.

Hereinafter, a display apparatus and a light-emitting device according to embodiments will be described with reference to the accompanying drawings. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there may be no intervening elements or layers present.

Like numbers or symbols refer to like elements throughout. The thickness and the ratio and the dimension of the element may be exaggerated for effective description of the technical contents. As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

It will be further understood that the terms "comprises", "comprising", "has", "having", "includes" and/or "including", when used in this specification, specify the presence of stated features, integers, steps, operations, elements, and/or components, but do not preclude the presence or addition of one or more other features, integers, steps, operations, elements, components, and/or groups thereof.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as 'not overlapping' or 'to not overlap' another element, this may include that the elements are spaced apart from each other, offset from each other, or set aside from each other or any other suitable term as would be appreciated and understood by those of ordinary skill in the art.

Unless otherwise defined or implied herein, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Figure 2:
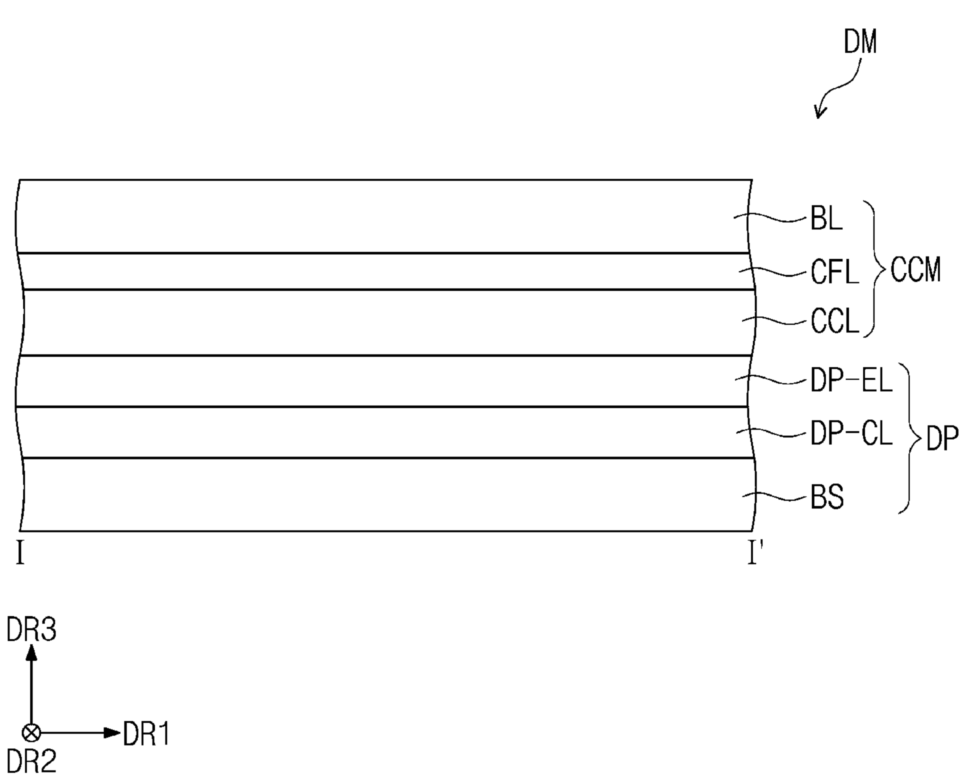
FIG. 2 is a schematic cross-sectional view of a display module according to an embodiment.

FIG. 1 is an exploded schematic perspective view of a display apparatus according to an embodiment. FIG. 2 is a schematic cross-sectional view of a display module according to an embodiment. FIG. 2 illustrates a cross-sectional view taken along line I-I' of FIG. 1.

In an embodiment, a display apparatus ES may be a large display apparatus such as a television, a monitor, or an external billboard. The display apparatus ES may be a small- and medium-sized display apparatus such as a personal computer, a notebook computer, a personal digital terminal, a car navigation unit, a game machine, a smartphone, a tablet computer, or a camera. These are presented only as examples, and it is to be understood that the display apparatus ES may be embodied as other display apparatuses without departing from the disclosure.

The display apparatus ES according to an embodiment may include a window WM, a display module DM, and a housing HAU. The display module DM may include a display panel DP. Although not illustrated in the drawings, the display apparatus ES may include, in addition to the display device, various devices activated in response to an electrical signal, such as a touch device or a detection device.

In FIG. 1 and the drawings below, a first direction DR1 to a third direction DR3 are illustrated, and the directions indicated by the first to third directions DR1, DR2, and DR3 described herein are relative concepts and may be changed into other directions.

In this specification, for convenience of explanation, the third direction DR3 may be defined as a direction in which an image may be provided to a user. The first direction DR1 and the second direction DR2 may be orthogonal to each other, and the third direction DR3 may be a direction normal to a plane defined by the first direction DR1 and the second direction DR2. In FIG. 1, the plane defined by the first direction DR1 and the second direction DR2 may be a display surface on which an image may be provided.

In the display apparatus ES according to an embodiment, the window WM may be disposed on the display module DM. The window WM may be made of a material including glass, sapphire, plastic, or a combination thereof. The window WM may include a transmission region TA that transmits the image provided from the display module DM, and a light blocking region BA which may be adjacent to the transmission region TA and through which an image may not be transmitted. Unlike the configuration illustrated in FIG. 1, in the display apparatus ES according to an embodiment, the window WM may be omitted.

In the display apparatus ES according to an embodiment, the display module DM may be disposed under the window WM. The display module DM may include the display panel DP and a light control member CCM disposed on the display panel DP.

The display panel DP may be a light-emitting display panel. For example, the display panel DP may be a light-emitting diode (LED) display panel, an organic electroluminescence display panel, or a quantum dot light-emitting display panel. However, embodiments are not limited thereto.

An LED display panel may include a light-emitting diode, a light-emitting layer of an organic electroluminescent display panel may include an organic electroluminescent material, and a light-emitting layer of a quantum dot light-emitting display panel may include quantum dots, quantum rods, or the like, or a combination thereof. Hereinafter, the display panel DP included in the display apparatus ES according to an embodiment of the disclosure will be described as an organic electroluminescence display panel. However, embodiments are not limited thereto.

The display apparatus ES according to an embodiment may include the display panel DP and the light control member CCM disposed on the upper side of the display panel DP, and the display apparatus ES according to an embodiment may be an organic electroluminescence display apparatus including an organic electroluminescence display panel. The display panel DP may provide first light having a wavelength. For example, the display panel DP may provide blue light as first light. However, embodiments are not limited thereto, and the display panel DP may emit white light.

The light control member CCM may convert a wavelength of the first light provided from the display panel DP or transmit the first light provided from the display panel DP. The light control member CCM may convert the wavelength of the first light provided from the display panel DP or transmit the first light.

On a plane, a surface of the display panel DP on which an image may be displayed is defined as a display surface. The display surface may include a display region DA in which an image may be displayed and a non-display region NDA in which an image may not be displayed. In a plan view, the display region DA may be defined in the center of the display panel DP and overlap the transparent region TA of the window WM.

A housing HAU may be disposed under the display panel DP and accommodate the display panel DP. The housing HAU may be disposed to cover the display panel DP so that an upper surface, which may be a display surface of the display panel DP, may be exposed. The housing HAU may cover the side surface and the bottom surface of the display panel DP, and may expose the entire upper surface.

Referring to FIG. 2, the display panel DP may include a base substrate BS, and a circuit layer DP-CL and a display device layer DP-EL which may be provided on the base substrate BS. In an embodiment, the base substrate BS, the circuit layer DP-CL, and the display device layer DP-EL may be sequentially stacked on each other in the third direction DR3.

The base substrate BS may be a member that provides a base surface on which the display device layer DP-EL may be disposed. The base substrate BS may be a glass substrate, a metal substrate, a plastic substrate, or the like, or a combination thereof. However, embodiments are not limited thereto, and the base substrate BS may be an inorganic layer, an organic layer, or a composite material layer.

In an embodiment, the circuit layer DP-CL may be disposed on the base substrate BS, and the circuit layer DP-CL may include transistors (not shown). Each of the transistors (not shown) may include a control electrode, an input electrode, and an output electrode. For example, the circuit layer DP-CL may include a switching transistor and a driving transistor for driving the light-emitting device ED (FIG. 4A) of the display device layer DP-EL.

The light control member CCM may be disposed on the display panel DP. The light control member CCM may include a light control layer CCL, a color filter layer CFL, and an upper base layer BL. For example, the display panel DP may include a light-emitting device ED (in FIG. 4A) that emits light of a first wavelength and/or light of a second wavelength, and the light control member CCM may include a light control layer CCL (in FIG. 4A) that converts the wavelength of light provided from the light-emitting device ED (in FIG. 4A) or transmits light.

Figure 3:
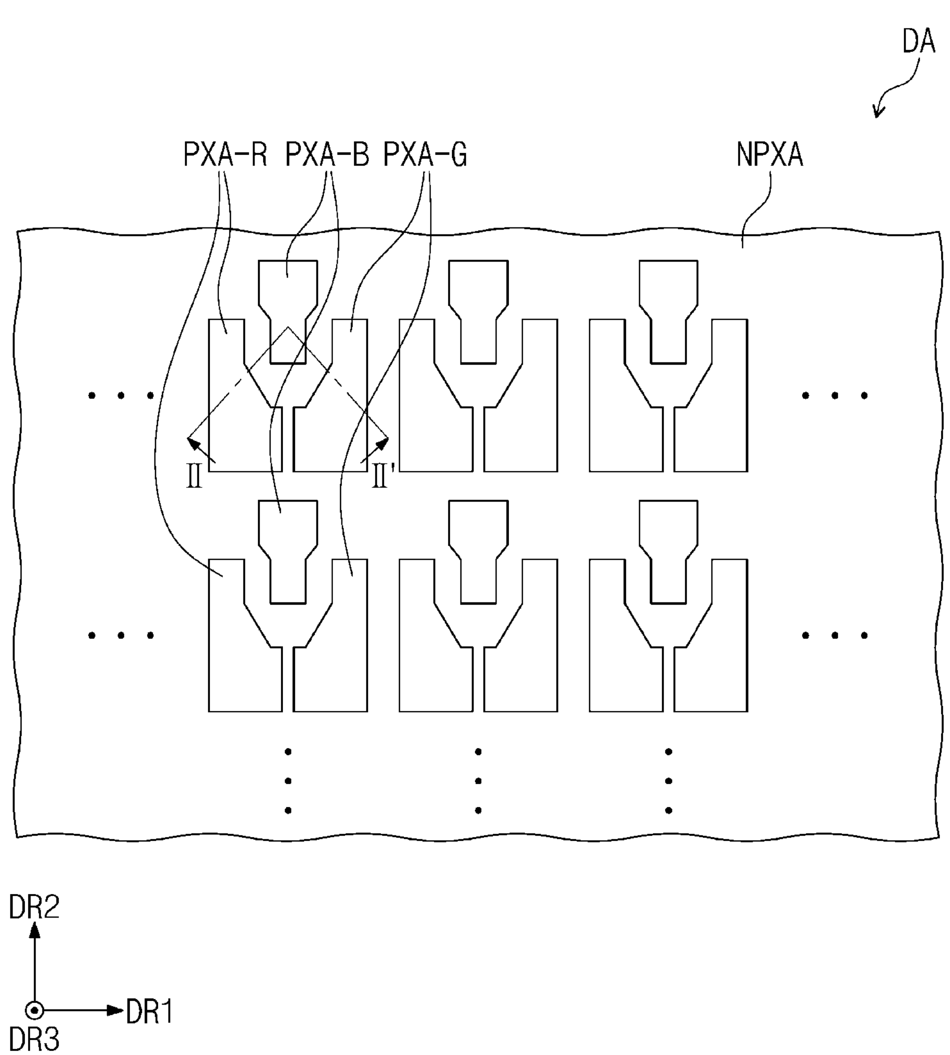
FIG. 3 is an enlarged plan view schematically illustrating a part of a display panel included in a display apparatus according to an embodiment.
Figure 4A:
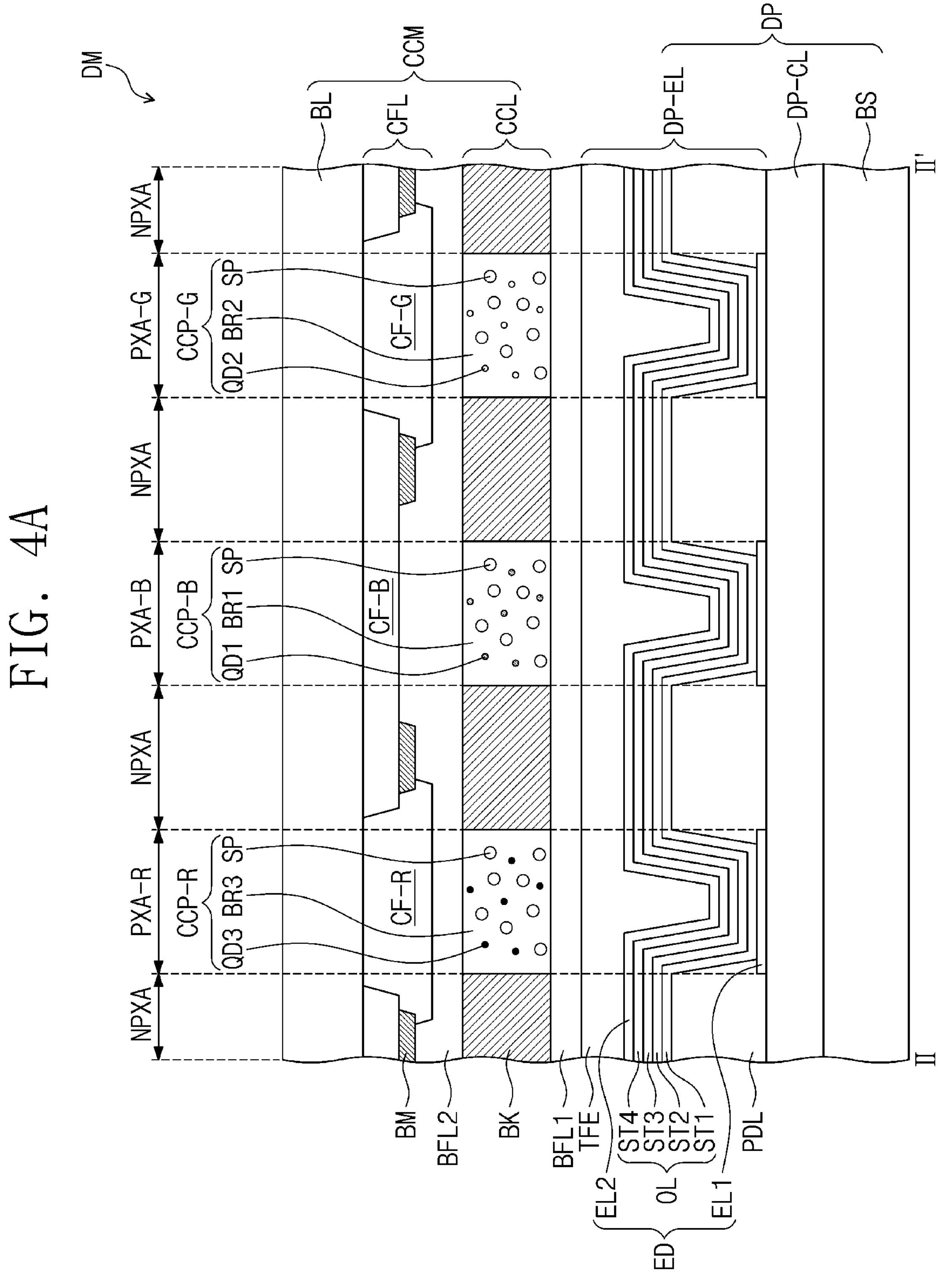
FIGS. 4A and 4B are enlarged cross-sectional views schematically illustrating a part of a display module included in a display apparatus according to an embodiment.
Figure 4B:
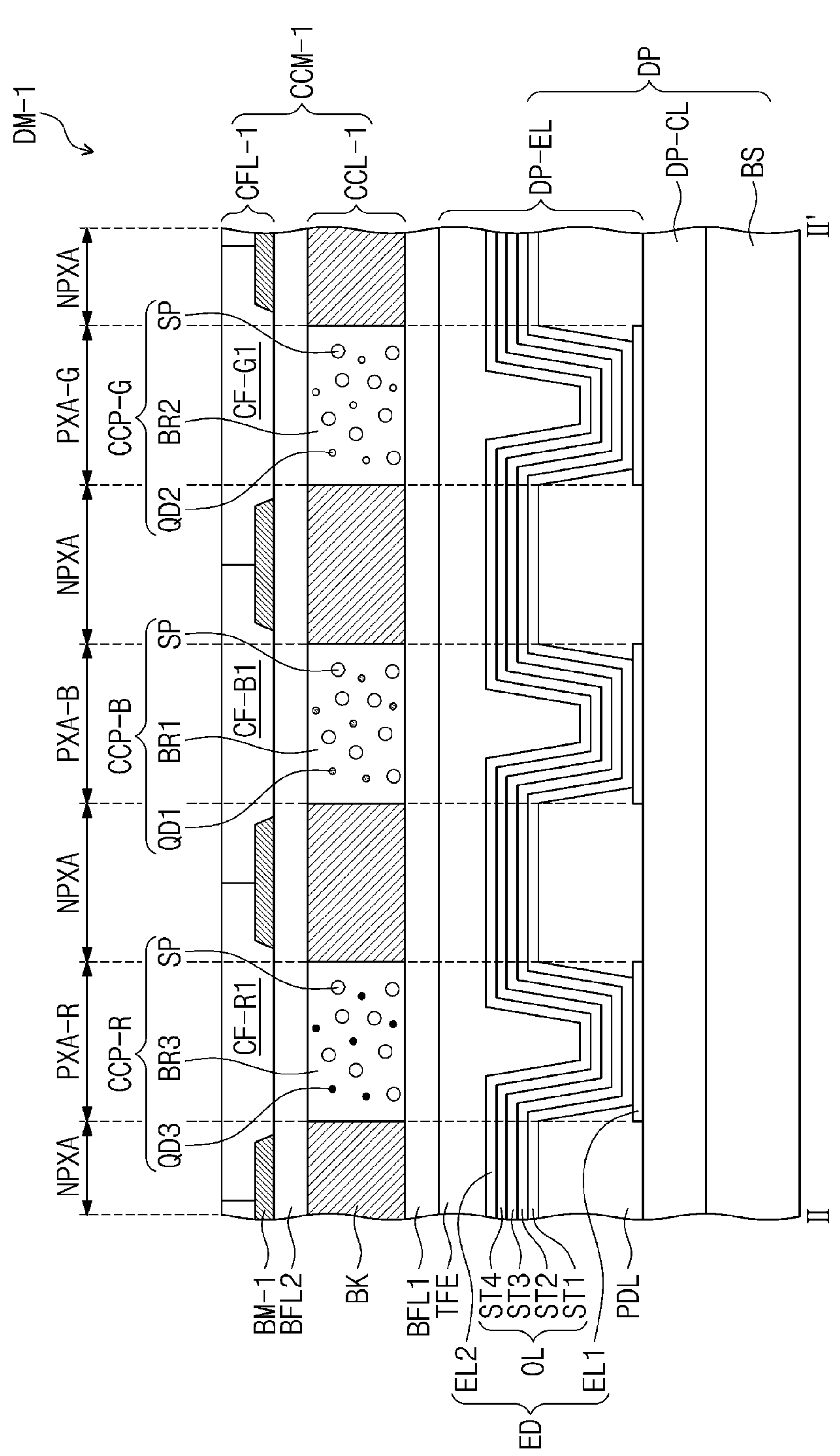

FIG. 3 is an enlarged plan view schematically illustrating a part of a display panel included in a display device according to an embodiment. FIGS. 4A and 4B are enlarged cross-sectional views schematically illustrating a part of a display module included in a display device. FIG. 3 illustrates a part of the display region DA of the display panel according to an embodiment. FIGS. 4A and 4B illustrate a portion taken along line II-II' of FIG. 3.

Hereinafter, the display modules DM, and DM-1 according to embodiments described with reference to FIGS. 3 and 4A to 4B may be included in the display apparatus ES of the embodiment described with reference to FIG. 1. The display modules DM, and DM-1 each may include a display panel DP and a light control member CCM.

The display module DM according to an embodiment may include the display panel DP and the light control member CCM disposed on the display panel DP, and the light control member CCM may include the light control layer CCL and the color filter layer CFL. The light control member CCM may include the upper base layer BL, the light control layer CCL disposed under the upper base layer BL, and the color filter layer CFL disposed between the light control layer CCL and the upper base layer BL. In the light control member CCM, the light control layer CCL may be disposed adjacent to the display panel DP.

The light control member CCM may include partition walls or banks BK and light control parts CCP-R, CCP-B, and CCP-G disposed between the banks BK.

Referring to FIGS. 3, 4A, and 4B, the display modules DM and DM-1 may include a non-pixel region NPXA and pixel regions PXA-R, PXA-B, and PXA-G. Each of the pixel regions PXA-R, PXA-B, and PXA-G may be a region in which light generated by the light-emitting device ED may be emitted. The areas of the respective pixel regions PXA-R, PXA-B, and PXA-G may be different from each other, and the area may mean an area in case viewed in a plan view.

The pixel regions PXA-R, PXA-B, and PXA-G may be divided into groups according to the color of the emitted light. In the display modules DM and DM-1 according to embodiments illustrated in FIGS. 3, 4A, and 4B, three pixel regions PXA-R, PXA-B, and PXA-G that emit red light, blue light, and green light are illustrated as examples. For example, the display apparatus ES (FIG. 1) according to an embodiment may include a red pixel region PXA-R, a blue pixel region PXA-B, and a green pixel region PXA-G that may be separated from each other. The blue pixel region PXA-B may be a first pixel region and may emit light having an emission wavelength of about 410 nm to about 480 nm. The green pixel region PXA-G may be a second pixel region and may emit light having an emission wavelength of about 500 nm to about 600 nm. The red pixel region PXA-R may be a third pixel region and may emit light having an emission wavelength of about 620 to about 700 nm.

In the display modules DM and DM-1 according to embodiments illustrated in FIGS. 4A and 4B, the display panel DP is illustrated as including the light-emitting device ED including an organic layer OL as a common layer. For example, in the display modules DM and DM-1 according to embodiments according to FIGS. 4A and 4B, the display panel DP may emit a same light regardless of pixel regions PXA-R, PXA-B, and PXA-G of the display modules DM and DM-1. For example, the display panel DP may provide blue light, as first light, to the light control members CCM and CCM-1. In other embodiments, the display panel DP may provide white light as the first light to the light control members CCM and CCM-1.

In the display modules DM and DM-1 according to embodiments illustrated in FIGS. 3, 4A and 4B, the red pixel region PXA-R and the green pixel region PXA-G among the pixel regions PXA-R, PXA-B, and PXA-G may have a same area, and the blue pixel region PXA-B may have a smaller area than the red pixel region PXA-R and the green pixel region PXA-G. However, embodiments are not limited thereto, and the respective pixel regions PXA-R, PXA-B, and PXA-G may have a same area or may have various areas depending on colors emitted from the light control parts CCP-R, CCP-B, and CCP-G. For example, in the display module DM according to an embodiment, the blue pixel region PXA-B may have the largest area, and the green pixel region PXA-G may have the smallest area. However, embodiments are not limited thereto, and the pixel regions PXA-R, PXA-B, and PXA-G may emit light of a color other than red light, blue light, and green light, or the pixel regions PXA-R, PXA-B, and PXA-G may be provided to have different area fractions.

The respective pixel regions PXA-R, PXA-B, and PXA-G may be regions divided by pixel defining layers PDL. The non-pixel regions NPXA may be regions provided between the neighboring pixel regions PXA-R, PXA-B, and PXA-G, and corresponding to the pixel defining layers PDL.

As illustrated in FIG. 3, a red pixel region PXA-R and a green pixel region PXA-G among the pixel regions PXA-R, PXA-B, and PXA-G may have a symmetrical shape with respect to a reference axis extending in the second direction DR2, and the blue pixel region PXA-B may be disposed between the red pixel region PXA-R and the green pixel region PXA-G. In case viewed in the first direction DR1, some of the blue pixel region PXA-B may not overlap the red pixel region PXA-R and the green pixel region PXA-G. However, embodiments are not limited thereto, and the pixel regions PXA-R, PXA-B, and PXA-G may have various polygonal or circular shapes, and an arrangement structure of the pixel regions is not limited. For example, the pixel regions may have a stripe structure in which the blue pixel region PXA-B, the green pixel region PXA-G, and the red pixel region PXA-R may be sequentially and alternately arranged, and the pixel regions PXA-R, PXA-B, and PXA-G may have a pentile (PENTILE®) structure.

Referring to FIGS. 4A and 4B, the display panel DP according to an embodiment may include the base substrate BS, the circuit layer DP-CL disposed on the base substrate BS, and the display device layer DP-EL disposed on the circuit layer DP-CL. The display device layer DP-EL may include the pixel defining layers PDL, the light-emitting device ED disposed between the pixel defining layers PDL, and the thin film encapsulation layer TFE disposed on the light-emitting device ED.

The pixel defining layers PDL may be formed of a polymer resin. For example, the pixel defining layers PDL may be formed of a polyacrylate-based resin or a polyimide-based resin. The pixel defining layers PDL may further include an inorganic material in addition to the polymer resin. The pixel defining layers PDL may include a light absorbing material or may include a black pigment or a black dye. The pixel defining layers PDL may be formed of an inorganic material. For example, the pixel defining layers PDL may be formed of silicon nitride ($SiN_x$), silicon oxide ($SiO_x$), silicon oxynitride ($SiO_xN_y$), or the like, or a combination thereof. The pixel defining layers PDL may define the pixel regions PXA-R, PXA-B, and PXA-G. The pixel regions PXA-R, PXA-B, and PXA-G and the non-pixel region NPXA may be divided by the pixel defining layers PDL.

The pixel defining layers PDL may overlap the banks BK. For example, the pixel defining layers PDL may respectively overlap the banks BK.

The light-emitting device ED may include the first electrode EL1 and the second electrode EL2 facing each other, and multiple organic layers OL disposed between the first electrode EL1 and the second electrode EL2. The organic layer OL of the light-emitting device ED may include stacks ST1, ST2, ST3, and ST4. Each of the stacks ST1, ST2, ST3, and ST4 may include functional layers including a hole transport material and an electron transport material, and the light-emitting layer including a light-emitting material. For example, the light-emitting device ED included in the display module DM according to an embodiment may be a light-emitting device having a tandem structure including multiple light-emitting layers. Hereinafter, descriptions of respective functional layers and light-emitting layers included in the light-emitting device ED will be described later.

FIGS. 4A and 4B illustrate an embodiment in which each of the stacks ST1, ST2, ST3, and ST4 included in the organic layer OL may be provided as a common layer in the entirety of the pixel regions PXA-R, PXA-B, and PXA-G and the non-pixel region NPXA. For example, each of the stacks ST1, ST2, ST3, and ST4 included in the light-emitting device ED may be partially disposed on the pixel defining layers PDL, and the stacks ST1, ST2, ST3, and ST4 disposed in the pixel regions PXA-R, PXA-B, and PXA-G may be connected to each other on the pixel defining layers PDL, so that common layers having an integral shape may be formed. Accordingly, each of the functional layers and the light-emitting layers disposed in the stacks ST1, ST2, ST3, and ST4 may also form common layers having an integral shape in the entirety of the pixel regions PXA-R, PXA-B, and PXA-G and the non-pixel region NPXA. However, embodiments are not limited thereto, and, unlike the configurations illustrated in FIGS. 4A and 4B, at least some of the stacks ST1, ST2, ST3, and ST4 may be provided by being patterned inside the openings defined in the pixel defining layers PDL in an embodiment. At least some of the stacks ST1, ST2, ST3, and ST4, or at least some of the functional layers and light-emitting layers included in the stacks ST1, ST2, ST3, and ST4 may be patterned by an inkjet printing method and provided inside openings of the pixel defining layers PDL defined to overlap the pixel regions PXA-R, PXA-B, and PXA-G.

The thin film encapsulation layer TFE may be disposed on the light-emitting device ED, and the thin film encapsulation layer TFE may be disposed on the second electrode EL2. The thin film encapsulation layer TFE may be directly disposed on the second electrode EL2. The thin film encapsulation layer TFE may be a single layer or a stack of layers. The thin film encapsulation layer TFE may include at least one insulating layer. The thin film encapsulation layer TFE according to an embodiment may include at least one inorganic layer (hereinafter, referred to as an encapsulation inorganic layer). The thin film encapsulation layer TFE according to an embodiment may include at least one organic layer (hereinafter, referred to as an encapsulation organic layer) and at least one encapsulation inorganic layer.

The encapsulation inorganic film may protect the light-emitting device ED from moisture/oxygen, and the encapsulation organic film may protect the light-emitting device ED from foreign substances such as dust particles. The encapsulation inorganic layer may include silicon nitride, silicon oxynitride, silicon oxide, titanium oxide, aluminum oxide, or a combination thereof, but embodiments are not limited thereto. The encapsulation organic layer may include an acrylic compound, an epoxy-based compound, or the like, or a combination thereof. The encapsulation organic layer may include a photopolymerizable organic material and is not particularly limited.

The display device ES according to an embodiment may include a light control member CCM disposed on a display panel DP. The light control member CCM may include an upper base layer BL and the light control layer CCL disposed under the upper base layer BL. The light control layer CCL may include banks BK and light control parts CCP-R, CCP-B, and CCP-G disposed between the banks BK spaced apart from each other. For example, the light control member CCM according to an embodiment may include the upper base layer BL, the banks BK disposed on the base layer BL, and the light control parts CCP-R, CCP-B, and CCP-G disposed between the banks BK spaced apart from each other. FIGS. 4A and 4B illustrate as an example that the upper base layer BL, which provides a reference surface on which the light control layer CCL may be disposed, may be provided separately, but embodiments are not limited thereto. Thus, the light control layer CCL may be disposed on the reference surface provided by the thin film encapsulation layer TFE of the display device layer DP-EL.

The light control member CCM according to an embodiment may include light control parts CCP-R, CCP-B, and CCP-G. The light control parts CCP-R, CCP-B, and CCP-G may include a first light control part CCP-B that allows light of a first wavelength to be transmitted, a second light control part CCP-G that converts the light of the first wavelength into light of the second wavelength, and a third light control part CCP-R that converts the light of the first wavelength or the light of the second wavelength into light of the third wavelength. The light of the second wavelength may be light having a longer wavelength region than the light of the first wavelength, and the light of the third wavelength may be light having a longer wavelength region than the light of the first wavelength and the light of the second wavelength. For example, the light of the first wavelength may be blue light, the light of the second wavelength may be green light, and the light of the third wavelength may be red light. The light of the first wavelength may be light having an emission wavelength of about 410 to about 480 nm, the light of the second wavelength may be light having an emission wavelength of about 500 to about 600 nm, and the light of the third wavelength may be light having a wavelength range of about 620 to about 700 nm. The light of the first wavelength and/or the second wavelength may be source light provided from the display panel DP to the light control layer CCL.

Each of the first light control part CCP-B, the second light control part CCP-G, and the third light control part CCP-R may include a light-emitting body. The light-emitting body may be a particle that converts the wavelength of the incident light to emit light of a different wavelength. In an embodiment, the light-emitting body included in the second light control part CCP-G and the third light control part CCP-R may be a quantum dot or phosphor. For example, the first light control part CCP-B may include a quantum dot QD1 that converts light of the second wavelength into light of the first wavelength, the second light control part CCP-G may include a quantum dot QD2 that converts light of the first wavelength into light of the second wavelength, and the third light control part CCP-R may include a quantum dots QD3 that converts light of the first wavelength or light of the second wavelength into light of the third wavelength. However, embodiments are not limited thereto, and the first light control part CCP-B may be a transmission part that transmits the wavelength of the first light. The first light control part CCP-B may not include a light-emitting body such as a quantum dot.

The quantum dot may be a particle that converts the wavelength of light provided. A core of the quantum dot may be selected from a group II-VI compound, a group III-VI compound, a group I-III-VI, a group III-V compound, a group III-II-V compound, a group IV-VI compound, a group IV element, a group IV compound, or a combination thereof.

The group II-VI compound may be selected from the group consisting of a binary compound selected from the group consisting of CdSe, CdTe, CdS, ZnS, ZnSe, ZnTe, ZnO, HgS, HgSc, HgTe, MgSe, MgS, or a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS or a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, or a mixture thereof.

The group III-VI compound may include a binary compound such as $In_2S_3$ and $In_2Se_3$, a ternary compound such as $InGaS_3$ and $InGaSe_3$, or any combination thereof.

The group I-III-VI compound may be selected from the group consisting of a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, or a mixture thereof, or a quaternary compound selected from the group consisting of $AgInGaS_2$, $CuInGaS_2$, or the like, or a combination thereof.

The group III-V compound may be selected from the group consisting of a binary compound selected from the group consisting of GaN, GaP, GaAs, GaSb, AlN, AlP, AlAs, AlSb, InN, InP, InAs, InSb, or a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP, or a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof. The group III-V compound may further include a group II metal. For example, InZnP or the like may be selected as the group III-II-V compound.

The group IV-VI compound may be selected from the group consisting of a binary compound selected from the group consisting of SnS, SnSe, SnTe, PbS, PbSe, PbTe, or a mixture thereof, a ternary compound selected from the group consisting of SnSeS, SnSeTe, SnSTe, PbSeS, PbSeTe, PbSTe, SnPbS, SnPbSe, SnPbTe, or a mixture thereof, and a quaternary compound selected from the group consisting of SnPbSSe, SnPbSeTe, SnPbSTe, or a mixture thereof. The group IV element may be selected from the group consisting of Si, Ge, or a mixture thereof. The group IV compound may be a binary compound selected from the group consisting of SiC, SiGe, or a mixture thereof.

The binary compound, the ternary compound, and/or the quaternary compound may be present in the particle with a uniform concentration, or may be present in a same particle with partially different concentrations. The quantum dot may have a core/shell structure in which one quantum dot surrounds another quantum dot. The interface between the core and the shell may have a concentration gradient in which the concentration of an element presents in the shell decreases toward the center thereof.

In some embodiments, the quantum dot may have a core-shell structure including a core having the above-described nanocrystals and a shell surrounding the core. The shell of the quantum dots may serve as a protective layer for maintaining semiconductor characteristics by preventing chemical modification of the core and/or serve as a charging layer for imparting electrophoretic characteristics to the quantum dot. The shell may be a single layer or multilayer. The interface between the core and the shell may have a concentration gradient in which the concentration of an element present in the shell decreases toward the center thereof. Examples of the shell of the quantum dots may include a metal or non-metal oxide, a semiconductor compound, or a combination thereof.

For example, examples of the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, or a ternary compound such as $MgAl_2O_4$, $CoFe_2O_4$, $NiFe_2O_4$, $CoMn_2O_4$, but embodiments are not limited thereto.

Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, or a combination thereof, but embodiments are not limited thereto.

The quantum dot may have a full width of half maximum (FWHM) of an emission wavelength spectrum of about 45 nm or less, about 40 nm or less, and in an embodiment about 30 nm or less, and within this range, the color purity or the color reproducibility may be improved. Light emitted through these quantum dots may be emitted in all directions, so that wide viewing angle characteristics may be improved.

The shape of the quantum dot is not particularly limited to a shape commonly used in the field. More specifically, the quantum dot may have a shape such as a spherical shape, a pyramidal shape, a multi-arm shape, or a cubic nanoparticle, a nanotube, a nanowire, a nanofiber, or a nanoplatelet particle.

The quantum dot may control the color of emitted light according to the particle size, and accordingly, the quantum dot may have various emission colors such as blue, red, and green.

The quantum dot may emit light in a shorter wavelength range as the particle size of the quantum dots may be smaller. For example, the particle size of the quantum dot that emits green light may be smaller than the particle size of the quantum dot that emits red light, and the particle size of the quantum dot that emits blue light may be smaller than the particle size of the quantum dot that emits green light.

Each of the light control parts CCP-R, CCP-B, and CCP-G included in the light control layer CCL may further include a scatterer SP. The first light control part CCP-B may include the first quantum dots QD1 and the scatterer SP, the second light control part CCP-G may include the second quantum dots QD2 and the scatterer SP, and the third light control part CCP-R may include the third quantum dots QD3 and the scatterer SP. However, embodiments are not limited thereto, and the first quantum dot QD1 may be omitted from the first light control part CCP-B, and the first light control part CCP-B may include only the scatterer SP.

The scatterer SP may be an inorganic particle. For example, the scatterer SP may include at least one among $TiO_2$, ZnO, $Al_2O_3$, $SiO_2$, and hollow silica. In other embodiments, the scatterer may be a mixture of two or more materials selected from among $TiO_2$, ZnO, $Al_2O_3$, $SiO_2$, and hollow silica.

The first light control part CCP-B, the second light control part CCP-G, and the third light control part CCP-R may respectively include base resins BR1, BR2, and BR3 for dispersing the quantum dots QD1, QD2, and QD3 and the scatterers SP. In an embodiment, the first light control part CCP-B may include the first quantum dots QD1 and the scatterers SP dispersed in the first base resin BR1, the second light control part CCP-G may include the second quantum dots QD2 and the scatterers SP dispersed in the second base resin BR2, and the third light control part CCP-R may include the third quantum dots QD3 and the scatterers SP dispersed in the third base resin BR3. The base resins BR1, BR2, and BR3 may be a medium in which the quantum dots QD1, QD2, and QD3 and the scatters SP are dispersed, and may be composed of various resin compositions that may be generally referred to as a binder. For example, the base resins BR1, BR2, and BR3 may be an acrylic resin, a urethane-based resin, a silicone-based resin, or an epoxy-based resin. The base resins BR1, BR2, and BR3 may be transparent resins. In an embodiment, the first base resin BR1, the second base resin BR2, and the third base resin BR3 may be the same as or different from each other.

The banks BK may define the openings that respectively separate the pixel regions PXA-R, PXA-B, and PXA-G overlapping the light control layer CCL. The light control parts CCP-R, CCP-B, and CCP-G may fill openings defined in the banks BK. The banks BK may include a light absorbing material or may include a black pigment or a black dyc.

The light control member CCM according to an embodiment may further include a color filter layer CFL. The color filter layer CFL may be disposed between the upper base layer BL and the light control layer CCL. The color filter layer CFL may include the light blocking part BM and filters CF-B, CF-G, and CF-R. The color filter layer CFL may include a first filter CF-B that transmits light of the first wavelength, a second filter CF-G that transmits light of the second wavelength, and a third filter CF-R that transmits light of the third wavelength. For example, the first filter CF-B may be a blue filter, the second filter CF-G may be a green filter, and the third filter CF-R may be a red filter. Each of the filter CF-B, CF-G, and CF-R may include a polymer photosensitive resin and a pigment or dye. The first filter CF-B may include a blue pigment or dye, the second filter CF-R may include a green pigment or dye, and the third filter CF-R may include a red pigment or dye. Embodiments are not limited thereto, and the first filter CF-B may not include the pigment or dye. The first filter CF-B may include a polymer photosensitive resin and may not include the pigment or dye. The first filter CF-B may be transparent. The first filter CF-B may be formed of a transparent photosensitive resin.

In an embodiment, the second filter CF-G and the third filter CF-R may be yellow filters. The second filter CF-G and the third filter CF-R may not be separated from each other and may be provided integrally.

A light blocking part BM may be a black matrix. The light blocking part BM may be formed by including an inorganic or organic light blocking material including a black pigment or black dye. The light blocking part BM may prevent light leakage phenomenon and demarcate a boundary between adjacent filters CF-B, CF-G, and CF-R. In an embodiment, the light blocking part BM may be formed using a blue filter. The light blocking parts BM may respectively correspond to and overlap the banks BK.

The first to third filters CF-B, CF-G, and CF-R may be disposed to respectively correspond to the blue pixel region PXA-B, the green pixel region PXA-G, and the red pixel region PXA-R.

The upper base layer BL may be disposed on the color filter layer CFL. The upper base layer BL may be a member that provides a base surface on which the color filter layer CFL and the light control layer CCL may be disposed. The upper base layer BL may be a glass substrate, a metal substrate, a plastic substrate, or the like. However, embodiments are not limited thereto, and the upper base layer BL may be an inorganic layer, an organic layer, or a composite material layer. Unlike the configuration illustrated, the upper base layer BL may be excluded in an embodiment.

Although not illustrated, the color filter layer CFL may further include a low refractive layer. The low refractive layer may be disposed between the filters CF-B, CF-G, and CF-R and the light control layer CCL. The refractive index of the low refractive layer may be about 1.1 to about 1.5. The refractive index value of the low refractive layer may be controlled by the proportions of hollow inorganic particles and/or voids included in the low refractive layer.

Although not illustrated, the display module DM may be disposed above or below the color filter layer CFL, and may further include an anti-reflection layer that blocks external light incident to the display module DM. The anti-reflection layer may block some of the external light. The anti-reflection layer may reduce reflected light generated from the display panel DP by the external light. The anti-reflection layer may be, for example, a polarizing layer. In an embodiment, the display module DM may include a polarization layer disposed under the upper base layer BL, and the color filter layer CFL may be excluded.

The light control member CCM may further include buffer layers BFL1 and BFL2 that block moisture, oxygen, etc., and protect the components disposed on the upper portion and lower portion thereof. The buffer layers BFL1 and BFL2 may include the first buffer layer BFL1 and the second buffer layer BFL2. The first buffer layer BFL1 may be disposed between the thin film encapsulation layer TFE and the light control layer CCL. The second buffer layer BFL2 may be disposed between the light control layer CCL and the color filter layer CFL.

The first buffer layer BFL1 may be a layer serving to prevent penetration of moisture and/or oxygen (hereinafter, referred to as 'moisture/oxygen') into the light control layer CCL. The first buffer layer BFL1 may be disposed under the light control layer CCL to block the light control layer CCL from being exposed to moisture/oxygen. The first buffer layer BFL1 may include at least one inorganic layer. For example, the first buffer layer BFL1 may include an inorganic material. For example, the first buffer layer BFL1 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or a combination thereof, or may include a metal thin film with sufficient light transmittance, etc. The first buffer layer BFL1 may further include an organic layer. The first buffer layer BFL1 may be formed of a single layer or multiple layers.

The second buffer layer BFL2 may be a protective layer that protects the light control layer CCL and the color filter layer CFL. The second buffer layer BFL2 may be an inorganic material layer including at least one inorganic material among silicon nitride, silicon oxide, and silicon oxynitride. The second buffer layer BFL2 may be formed of a single layer or multiple layers.

Referring to FIG. 4B, the display module DM-1 according to an embodiment may include a display panel DP and a light control member CCM-1 disposed on the display panel DP, and the light control member CCM-1 may include a light control layer CCL-1 and a color filter layer CFL-1. In the display module DM-1 according to an embodiment, the light control layer CCL-1 may be disposed on the display panel DP. The light control layer CCL-1 may be disposed on the display panel DP with the first buffer layer BFL1 therebetween.

The light control layer CCL-1 of the light control member CCM-1 may include banks BK and light control parts CCP-R, CCP-B, and CCP-G disposed between the banks BK. The color filter layer CFL-1 may include a light blocking part BM-1 and filters CF-R1, CF-B1, and CF-G1.

Compared to the display module DM illustrated in FIG. 4A, the display module DM-1 according to an embodiment illustrated in FIG. 4B is an embodiment in which the upper base layer BL may be excluded, and the light control layer CCL-1 and the color filter layer CFL-1 may be disposed while the upper surface of the thin film encapsulation layer serves as the base surface. For example, the light control parts CCP-R, CCP-B, and CCP-G of the light control layer CCL-1 may be formed on the display panel DP through a continuous process, and the filters CF-R1, CF-B1, and CF-G1 of the color filter layer CFL-1 may be sequentially formed on the light control layer CCL-1 through a continuous process.

Although not illustrated, the color filter layer CFL-1 may include a low refractive index layer. Some of the light blocking parts BM-1 and the filters CF-R1, CF-B1, and CF-G1 included in the color filter layer CFL-1 may be excluded. The light control member CCM-1 may further include buffer layers BFL1 and BFL2 that block moisture and oxygen and protect the components disposed thereabove and therebelow. The buffer layers BFL1 and BFL2 may include the first buffer layer BFL1 disposed between the thin film encapsulation layer TFE and the light control layer CCL-1, and the second buffer layer BFL2 disposed between the light control layer CCL-1 and the color filter layer CFL-1.

FIGS. 5 and 6A to 6D are cross-sectional views schematically illustrating a light-emitting device according to an embodiment. Hereinafter, light-emitting devices ED, ED-1, ED-2, and ED-3 according to embodiments will be described with reference to FIGS. 5 and 6A to 6D.

Figure 5:
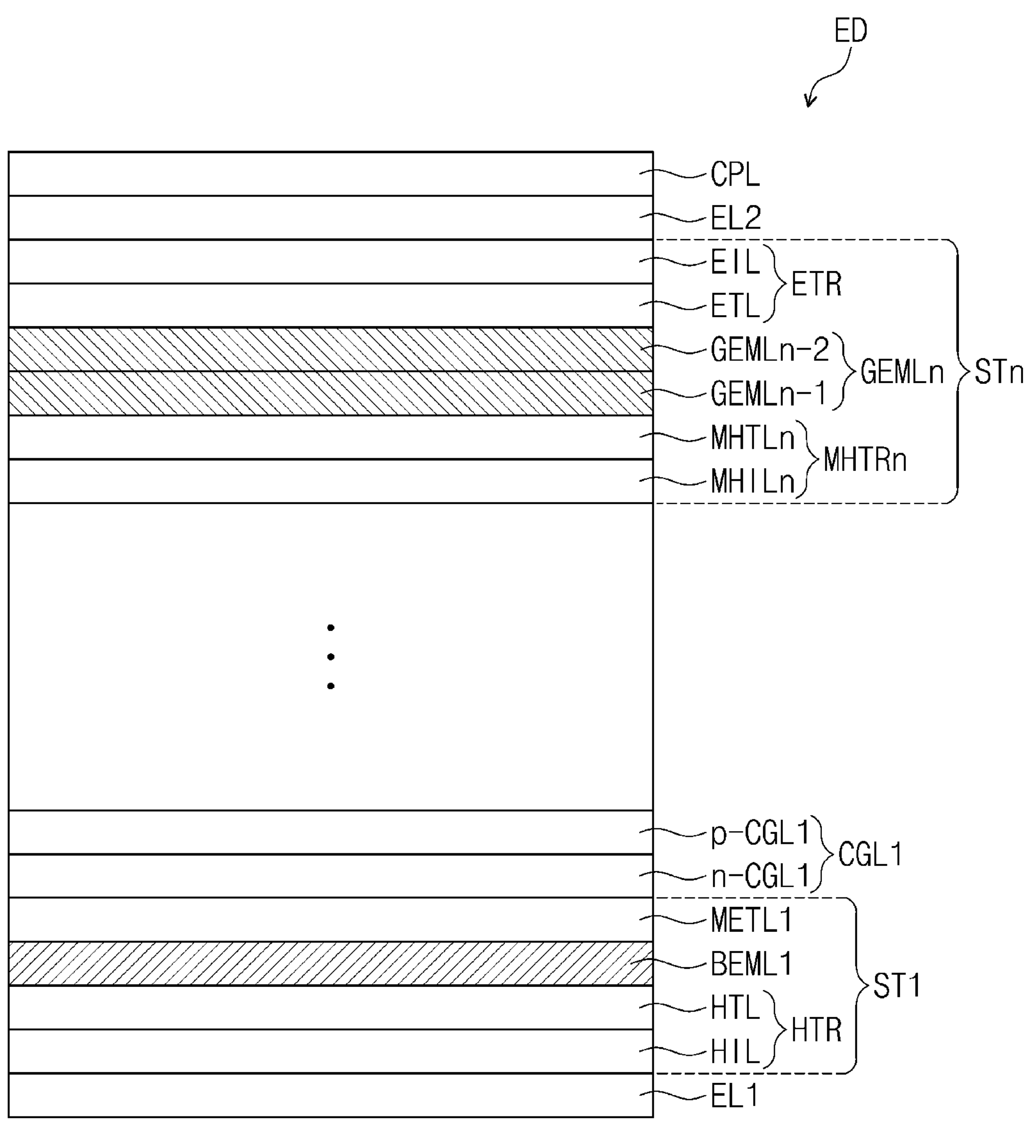
FIG. 5 is a cross-sectional view schematically illustrating a light-emitting device according to an embodiment.

Referring to FIG. 5, the light-emitting device ED may include the first electrode EL1, the second electrode EL2, and n stacks ST1 and STn disposed between the first electrode EL1 and the second electrode EL2, where n may be an integer of 2 or more. For example, the light-emitting device ED may include at least two stacks, and may include, for example, two stacks, three stacks, or four or more stacks.

The light-emitting device ED according to an embodiment essentially may include a stack ST1 having at least a first light-emitting layer BEML1 and a stack STn having a second light-emitting layer GEMLn. In the disclosure, the first light-emitting layer BEML1 refers to a light-emitting layer that emits light of a first wavelength, and the second light-emitting layer GEMLn refers to a light-emitting layer that emits light of a second wavelength. Numbers (1, n) subsequent to the reference numbers or symbols of the first and second light-emitting layers BEML1 and GEMLn indicate which stack each light-emitting layer may be included in. However, the order of each stack is not limited to the configuration in FIG. 5.

A charge generation layer CGL1 may be disposed between adjacent stacks of the stacks ST1 and STn. The charge generation layer CGL1 may include a p-type charge generation layer p-CGL1 and/or an n-type charge generation layer n-CGL1. The charge generation layer CGL1 may promote the movement of holes and/or charges.

Hereinafter, an example of the light-emitting devices ED, ED-1, ED-2, and ED-3 including four stacks will be described in detail with reference to FIGS. 6A to 6D.

Figure 6A:
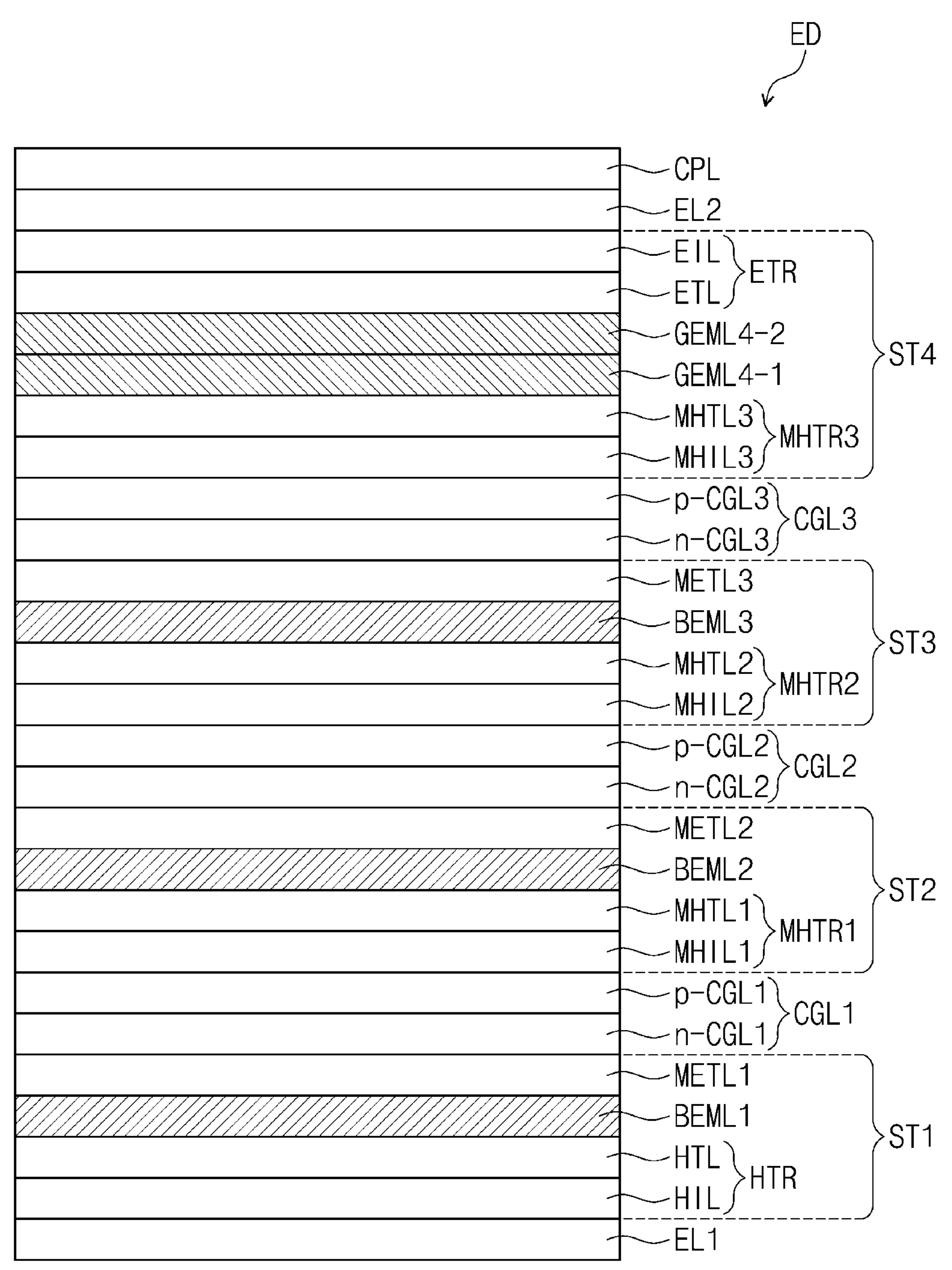
FIGS. 6A to 6D are cross-sectional views schematically illustrating a light-emitting device according to an embodiment.

Referring to FIG. 6A, the light-emitting device ED according to an embodiment may include a first electrode EL1, a second electrode EL2 facing the first electrode EL1, and stacks ST1, ST2, ST3, and ST4 disposed between the first electrode EL1 and the second electrode EL2. The stacks ST1, ST2, ST3, and ST4 may include the first stack ST1, the second stack ST2, the third stack ST3, and the fourth stack ST4. The first stack ST1, the second stack ST2, the third stack ST3, and the fourth stack ST4 may each include a light-emitting layer. Although FIG. 6A illustrates that the light-emitting device ED includes a total of four stacks ST1, ST2, ST3, and ST4, embodiments are not limited thereto, and the light-emitting device ED may include two, three, or five or more stacks. For example, in the light-emitting device ED structure illustrated in FIG. 6A, the second stack ST2 and the third stack ST3 may be omitted, and the light-emitting device structure having two stacks of the first stack ST1 and the fourth stack ST4 may be provided.

In the light-emitting device ED according to an embodiment, a hole transport region HTR may be disposed between the first electrode EL1 and the light-emitting layers BEML1, BEML2, BEML3, and GEML4-1. An electron transport region ETR may be disposed between the second electrode EL2 and the stacks BEML1, BEML2, BEML3, and GEML4-2. In an embodiment, the light-emitting device ED may emit light in a direction from the first electrode EL1 to the second electrode EL2. It is illustrated that based on a light-emitting direction, the light-emitting device ED according to an embodiment has a structure in which the hole transport region HTR may be disposed under the light-emitting layers BEML1, BEML2, BEML3, and GEML4-1 and the electron transport region ETR may be disposed above the light-emitting layers BEML1, BEML2, BEML3, and GEML4-2. However, embodiments are not limited thereto, and, based on the light-emitting direction, the light-emitting device may have an inverted device structure in which the electron transport region ETR may be disposed below the stacks BEML1, BEML2, BEML3, and GEML4-1 and the hole transport region HTR may be disposed above the stacks BEML1, BEML2, BEML3, and GEML4-2.

The light-emitting device ED according to an embodiment may include the charge generation layers CGL1, CGL2, and CGL3 disposed between stacks ST1, ST2, ST3, and ST4. The light-emitting device ED according to an embodiment may include the first charge generation layer CGL1 disposed between the first stack ST1 and the second stack ST2, the second charge generation layer CGL2 disposed between the second stack ST2 and the third stack ST3, and the third charge generation layer CGL3 disposed between the third stack ST3 and the fourth stack ST4.

In case that a voltage is applied to the charge generation layers CGL1, CGL2, and CGL3, charges (electrons and holes) may be generated by forming a complex through an oxidation-reduction reaction. The charge generation layers CGL1, CGL2, and CGL3 may provide the generated charges to the adjacent stacks ST1, ST2, ST3, and ST4, respectively. The charge generation layers CGL1, CGL2, and CGL3 may double an efficiency of the current generated in each of the adjacent stacks ST1, ST2, ST3, and ST4, and may serve to adjust the balance of the charges between the adjacent stacks ST1, ST2, ST3, and ST4.

The charge generation layers CGL1, CGL2, and CGL3 may respectively have layered structures in which n-type charge generation layers n-CGL1, n-CGL2, and n-CGL3 and p-type charge generation layers p-CGL1, p-CGL2, and p-CGL3 may be respectively bonded to each other. The first charge generation layer CGL1 may have a layered structure in which the first n-type charge generation layer n-CGL1 and the first p-type charge generation layer p-CGL1 may be bonded to each other. The second charge generation layer CGL2 may have a layered structure in which a second n-type charge generation layer n-CGL2 and a second p-type charge generation layer p-CGL2 may be bonded to each other. The third charge generation layer CGL3 may have a layered structure in which a third n-type charge generation layer n-CGL3 and a third p-type charge generation layer p-CGL3 may be bonded to each other.

The n-type charge generation layers n-CGL1, n-CGL2, and n-CGL3 may be charge generation layers that provide electrons to adjacent stacks. The n-type charge generation layers n-CGL1, n-CGL2, and n-CGL3 may be layers in which a base material may be doped with an n-dopant. The p-type charge generation layers p-CGL1, p-CGL2, and p-CGL3 may be charge generation layers that provide holes to adjacent stacks. Although not illustrated, buffer layers may be further disposed between the n-type charge generation layers n-CGL1, n-CGL2, and n-CGL3 and the p-type charge generation layers p-CGL1, p-CGL2, and p-CGL3.

The charge generation layers CGL1, CGL2, and CGL3 may each include an n-type arylamine-based material or a p-type metal oxide. For example, the respective charge generation layers CGL1, CGL2, and CGL3 may include a charge generating compound composed of an arylamine-based organic compound, a metal, a metal oxide, a metal carbide, a metal fluoride, or a mixture thereof.

For example, the arylamine-based organic compound may be α-NPD, 2-TNATA, TDATA, MTDATA, sprio-TAD, or sprio-NPB. For example, the metal may be at least one of cesium (Cs), molybdenum (Mo), vanadium (V), titanium (Ti), tungsten (W), barium (Ba), and lithium (Li). For example, the oxide, carbide, and fluoride of the metal may be $Re_2O_7$, $MoO_3$, $V_2O_5$, $WO_3$, $TiO_2$, $Cs_2CO_3$, BaF, LiF, or CsF.

In the light-emitting device ED according to an embodiment, the first stack ST1, the second stack ST2, and the third stack ST3 may respectively include first light-emitting layers BEML1, BEML2, and BEML3 that emit light of a first wavelength. The light of the first wavelength may be light of a blue wavelength region. In an embodiment, the first wavelength may be about 420 nm to about 480 nm. The first light-emitting layers BEML1, BEML2, and BEML3 may include an organic material that emits light having a wavelength of about 420 to about 480 nm. For example, the first light-emitting layers BEML1, BEML2, BEML3 may include a host and a dopant.

The first light-emitting layers BEML1, BEML2, and BEML3 each may have a single layer structure. Unlike the second light-emitting layer GEML4-1 and GEML4-2, the first light-emitting layers BEML1, BEML2, and BEML3 may not have a double layer structure. The first light-emitting layers BEML1, BEML2, and BEML3 having the single layer structure may have a thickness of about 10 nm to about 40 nm, but embodiments are not limited thereto.

In the light-emitting device ED according to an embodiment, the fourth stack ST4 may include second light-emitting layer GEML4-1 and GEML4-2 that emit light of a second wavelength. The light of the second wavelength may be light in a green wavelength region. In an embodiment, the second wavelength may be about 520 nm to about 600 nm.

The second light-emitting layer GEML4-1 and GEML4-2 may have a double layer structure. In an embodiment, one layer GEML4-1 of the double layer structure may include a hole-transporting first host (hereinafter, referred to as a hole-transporting host), and the other layer GEML4-2 may include an electron-transporting second host (hereinafter, referred to as an electron-transporting host). The hole-transporting host may be a material including a hole-transporting moiety in a molecular structure. The electron-transporting host may be a material including an electron-transporting moiety in a molecular structure. Another layer may not be disposed between the respective layers GEML4-1 and GEML4-2 of the double layer, and the two layers may be in contact with each other.

The second light-emitting layer GEML4-1 and GEML4-2 may include a first sub light-emitting layer GEML4-1 and a second sub light-emitting layer GEML4-2. The first sub light-emitting layer GEML4-1 and the second sub light-emitting layer GEML4-2 may be in contact with each other. The second light-emitting layer GEML4-1 and GEML4-2 may have a thickness of about 10 nm to about 30 nm. The first sub light-emitting layer GEML4-1 and the second sub light-emitting layer GEML4-2 may respectively have a thickness of about 5 nm to about 25 nm. The first sub light-emitting layer GEML4-1 and the second sub light-emitting layer GEML4-2 may have a same thickness. However, embodiments are not limited thereto, and the first sub light-emitting layer GEML4-1 and the second sub light-emitting layer GEML4-2 may have different thicknesses.

The first sub light-emitting layer GEML4-1 may include a hole-transporting host material and a first dopant that emits light of a second wavelength, and the second sub light-emitting layer GEML4-2 may include an electron-transporting host material and a second dopant that emits light of a second wavelength. In an embodiment, the first dopant and the second dopant may include different materials. However, embodiments are not limited thereto, and the first dopant and the second dopant may include a same material.

In the light-emitting device ED according to an embodiment, the highest occupied molecular orbital (HOMO) energy level difference between the hole-transporting host and the first dopant included in the first sub light-emitting layer GEMLA-1 may be about 0.2 eV or less, and the HOMO energy level difference between the electron-transporting host and the second dopant included in the second sub light-emitting layer GEML4-2 may be about 0.1 eV or more.

In the light-emitting device ED according to an embodiment, the first sub light-emitting layers GEMLA-1 may include, as a host, any one among Compound Groups HT below. However, embodiments are not limited thereto.

[Compound Group HT]

HT-1

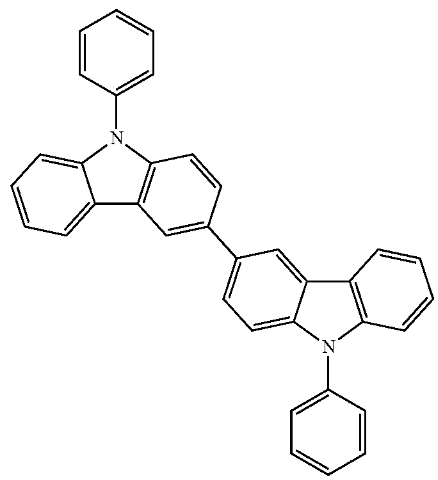

-continued
HT-2
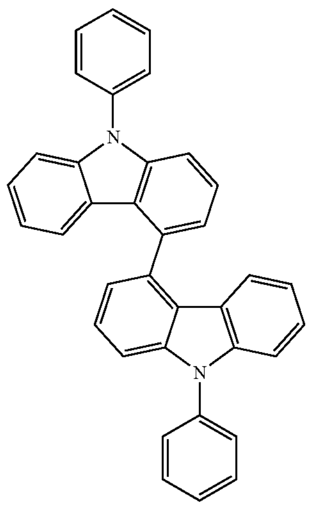
HT-3
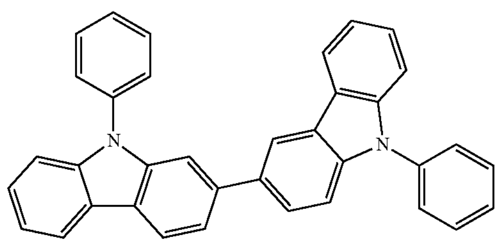
HT-4
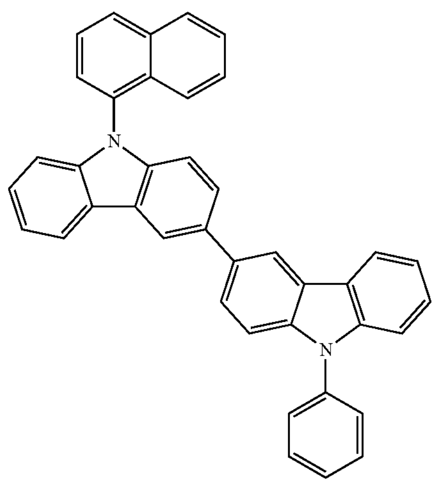
-continued
HT-5
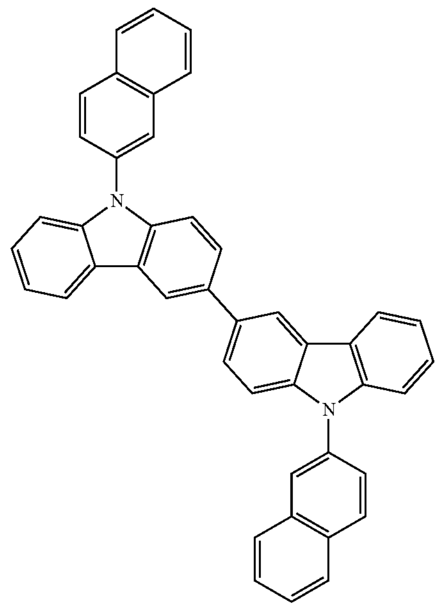
HT-6
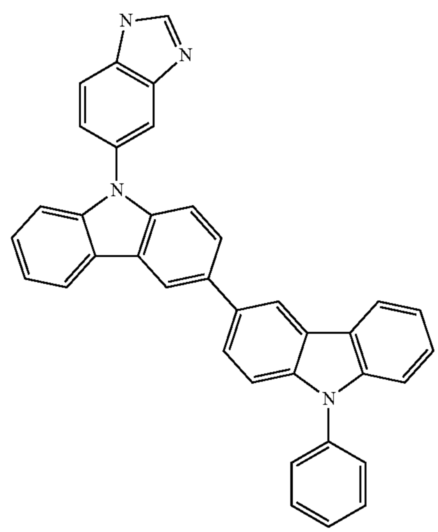
HT-7
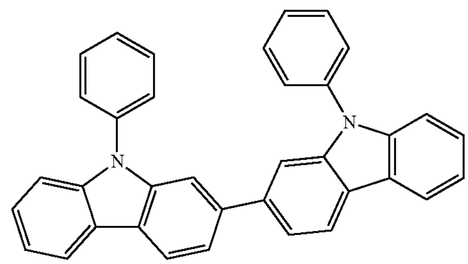

-continued
HT-8
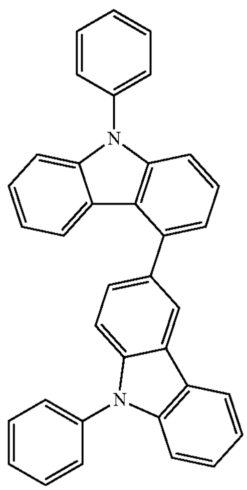
HT-9
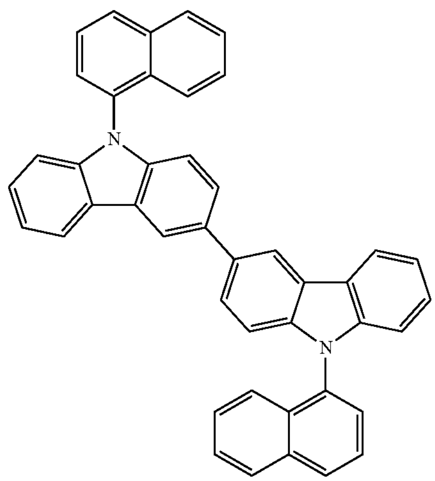
HT-10
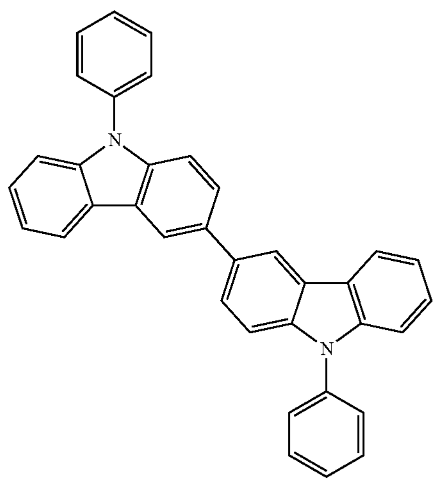
-continued
HT-11
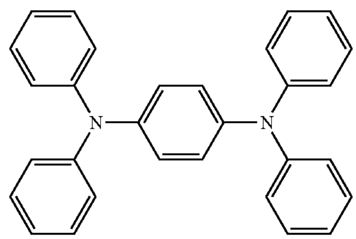
HT-12
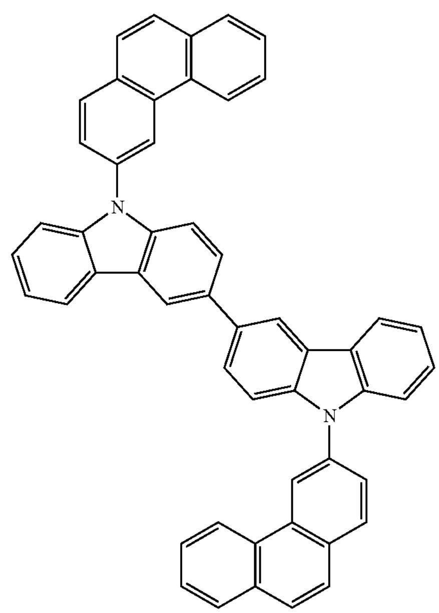
HT-13
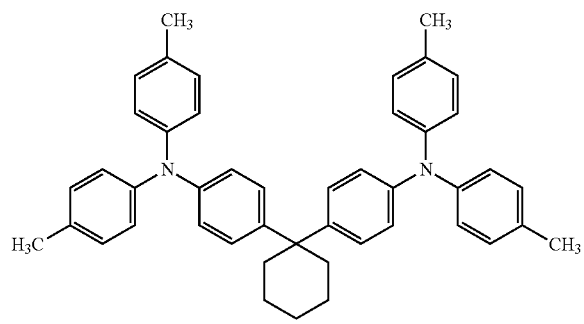

-continued
HT-14
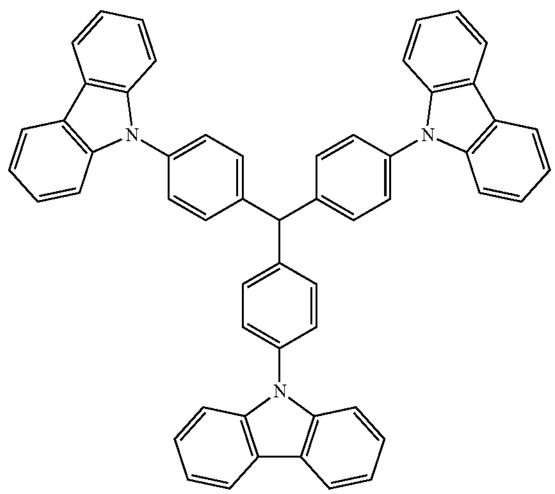
HT-15
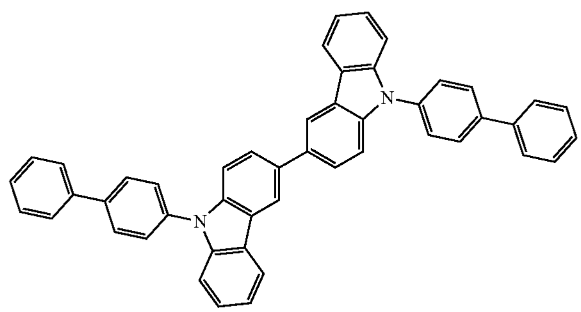
In the light-emitting device ED according to an embodiment, the second sub light-emitting layer GEML4-2 may include, as a host, any one among Compound Groups ET below. However, embodiments are not limited thereto.
[Compound Group ET]
ET-1
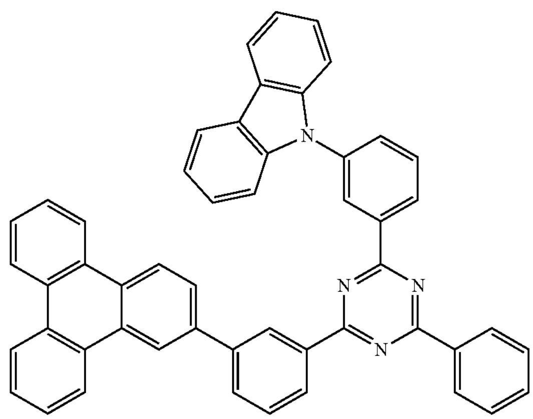
-continued
ET-2
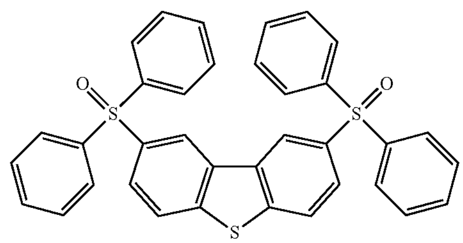
ET-3
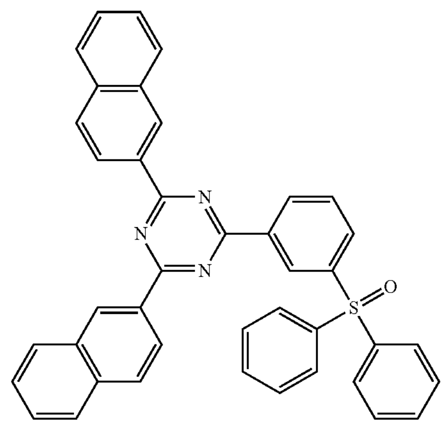
ET-4
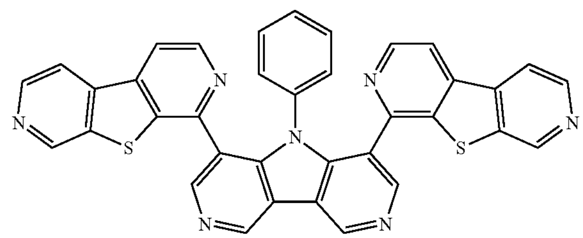
ET-5
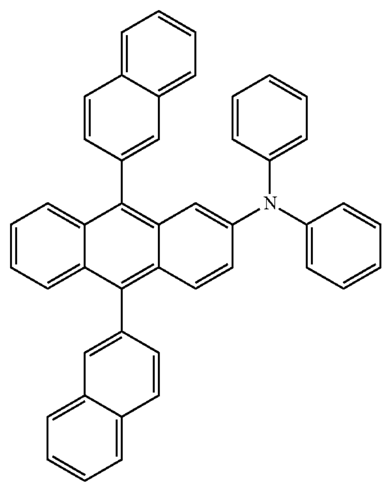

-continued

ET-6

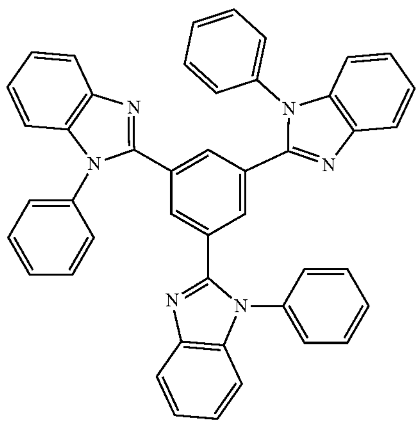

ET-7

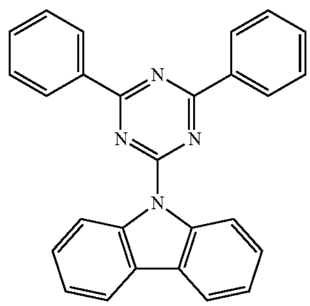

ET-8

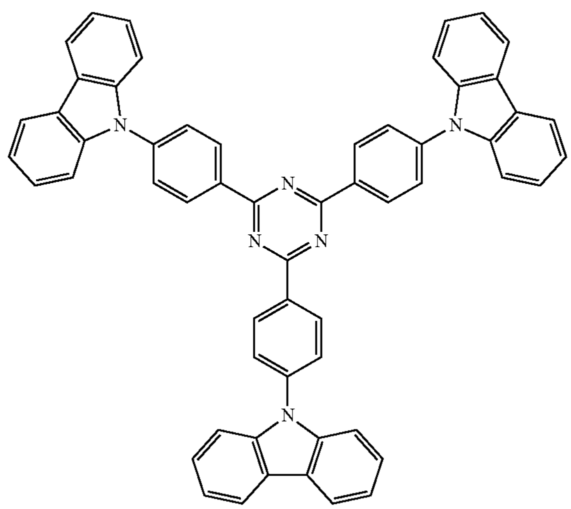

ET-9

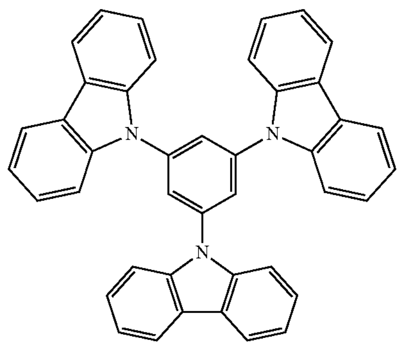

In the light-emitting device ED according to an embodiment, the first dopant included in the first sub light-emitting layer GEML4-1 may have an organometallic compound in which the central metal may be platinum (Pt).

In an embodiment, the first dopant may be represented by the Formula M-a below.

[Formula M-a]

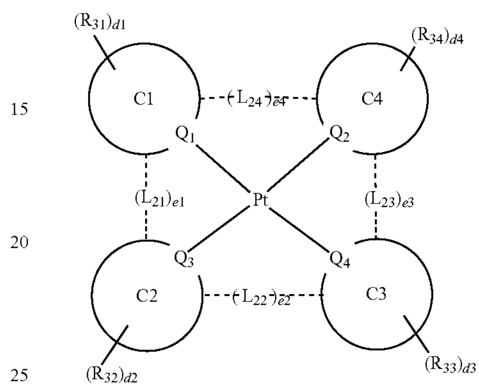

In Formula M-a, $Q_1$ to $Q_4$ are each independently C or N, C1 to C4 are each independently a substituted or unsubstituted hydrocarbon ring having 5 to 30 ring-forming carbon atoms, or a substituted or unsubstituted heterocycle having 2 to 30 ring-forming carbon atoms. $L_{21}$ to $L_{24}$ are each independently a direct linkage,

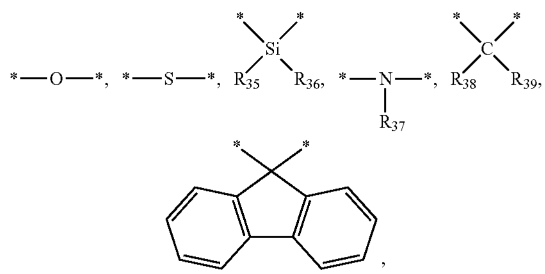

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 are each independently 0 or 1. $R_{31}$ to $R_{39}$ are each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or bonded to an adjacent group to form a ring, and d1 to d4 are each independently an integer of 0 to 4.

The compound represented by Formula M-a may be represented by any among Compound Groups M-a below. However, the compounds below are mere examples, and thus the compound represented by Formula M-a is not limited to those represented by the compounds below.

[Compound Group M-a]
M-a-1
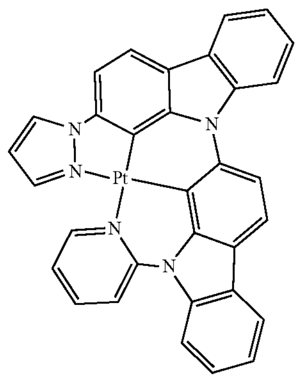
M-a-2
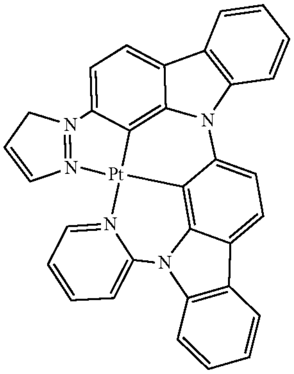
M-a-3
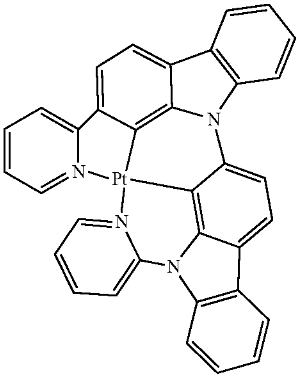
M-a-4
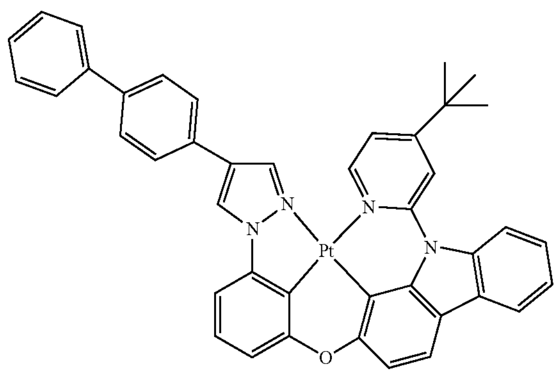
-continued
M-a-5
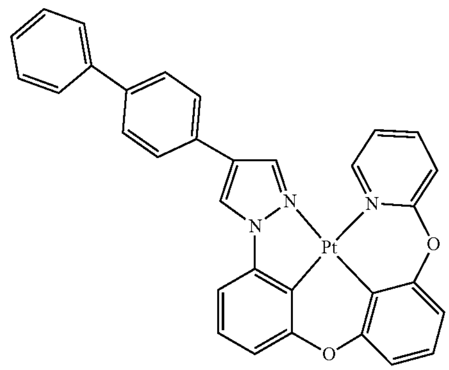
M-a-6
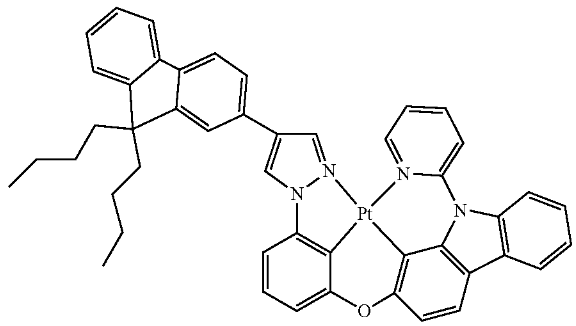
M-a-7
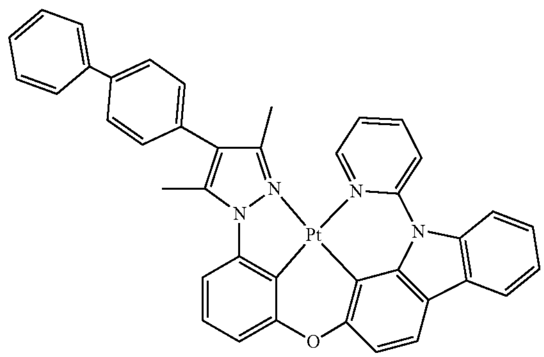
M-a-8
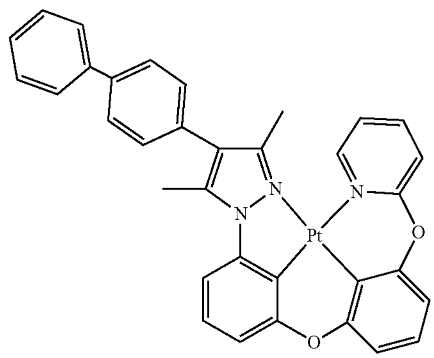

-continued
M-a-9
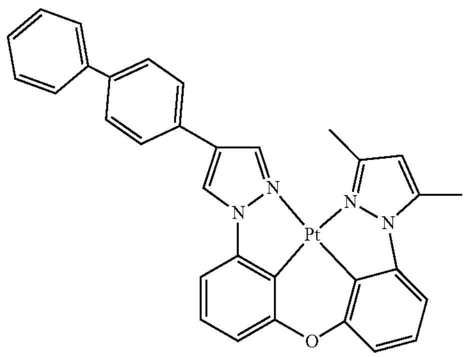
M-a-10
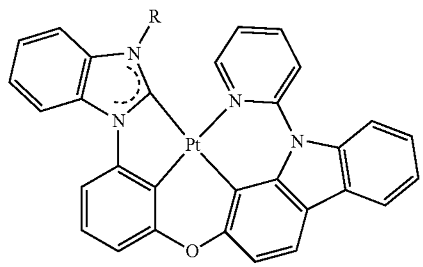
M-a-11
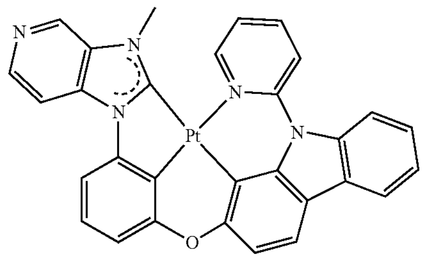
M-a-12
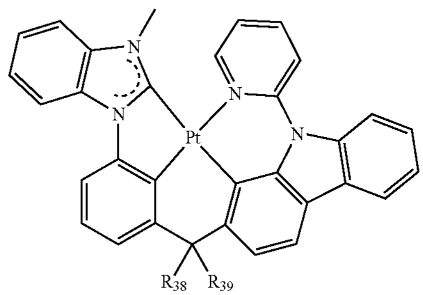
M-a-13
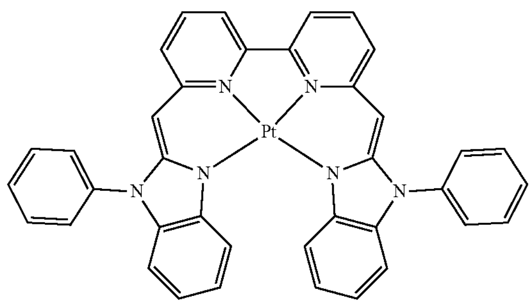
-continued
M-a-14
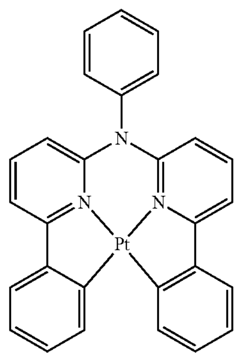
M-a-15
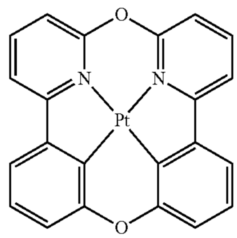
M-a-16
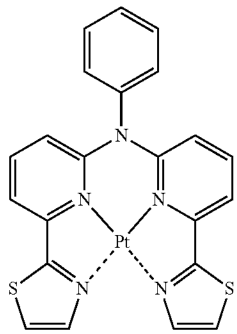
M-a-17
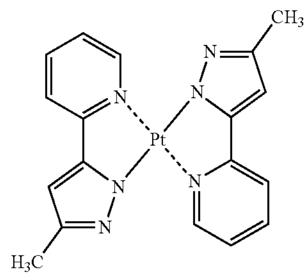
M-a-18
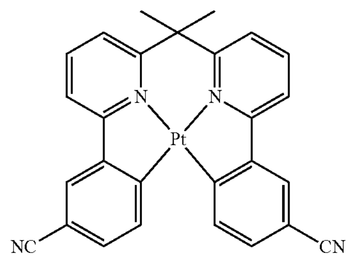
In the compounds above, R, $R_{38}$, and $R_{39}$ may be each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In the light-emitting device ED according to an embodiment, the second dopant included in the second sub light-emitting layer GEML4-2 may include an organometallic compound having a central metal of iridium (Ir).

In an embodiment, the second dopant may be represented by the Formula M-b below.

[Formula M-b]

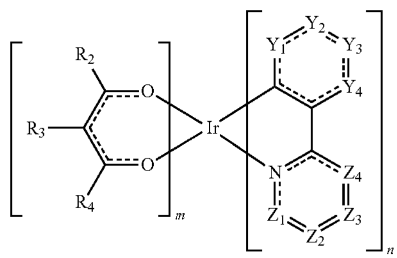

In Formula M-b, $Y_1$ to $Y_4$, and $Z_1$ to $Z_4$ are each independently $CR_1$ or N, $R_1$ to $R_4$ are each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or bonded to an adjacent group to form a ring. In Formula M-b, m may be 0 or 1 and n may be 2 or 3. In Formula M-b, in case that m is 0, n may be 3, and in case that m is 1, n may be 2.

The compound represented by Formula M-b may be represented by any one among Compound Groups M-b below. However, the compounds below are mere examples, and thus the compound represented by Formula M-b is not limited to the compounds below.

[Compound Group M-b]

M-b1

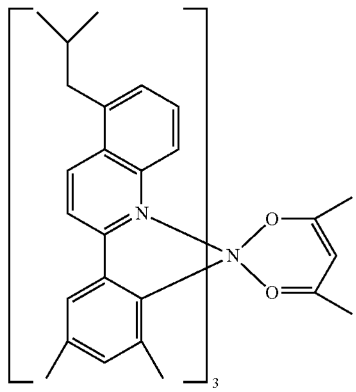

-continued

M-b2

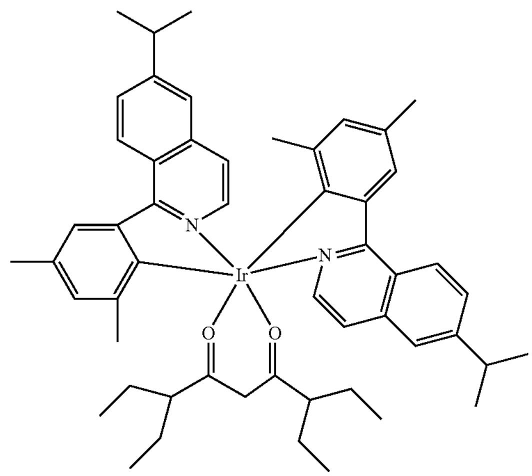

M-b3

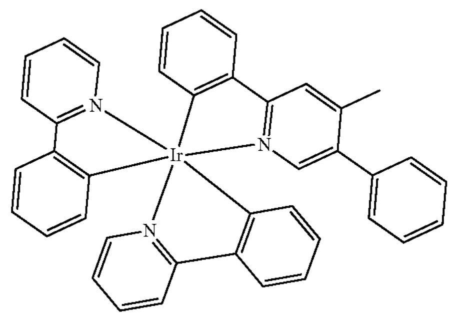

M-b4

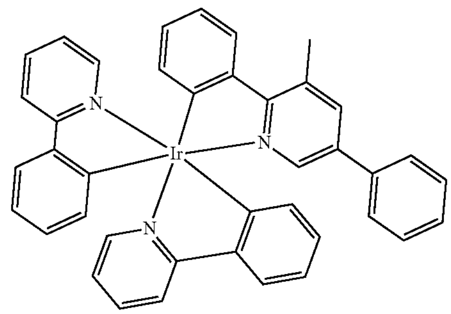

M-b5

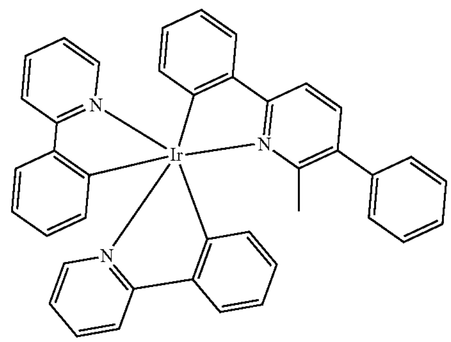

-continued
M-b6
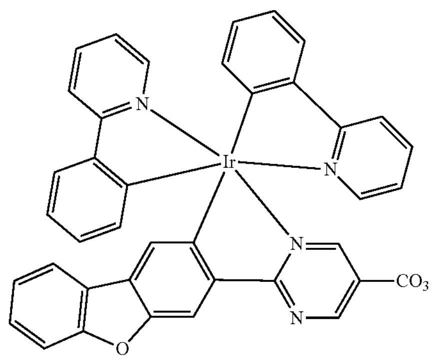
M-b7
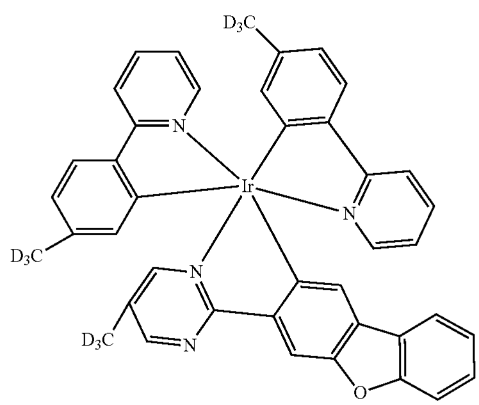
M-b8
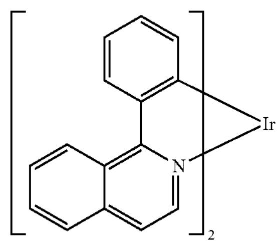
M-b9
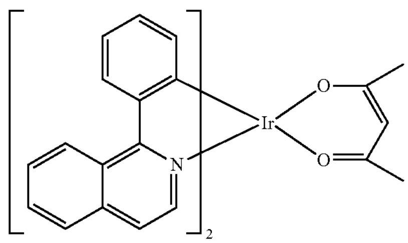
M-b10
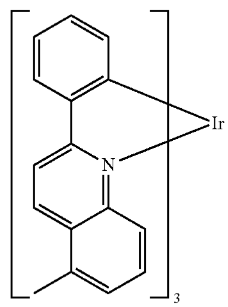
-continued
M-b11
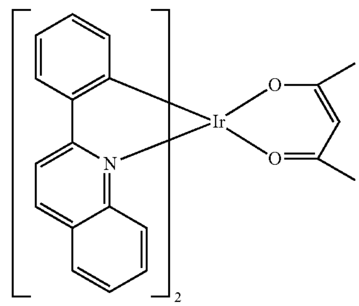
M-b12
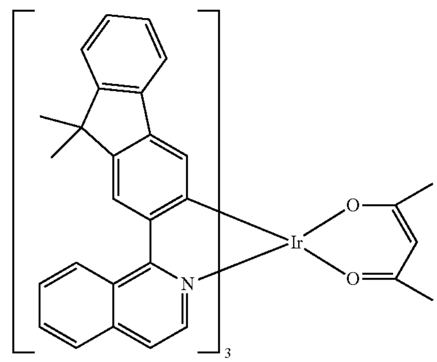
M-b13
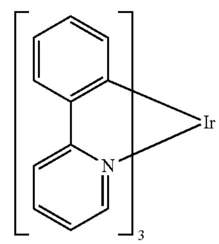
M-b14
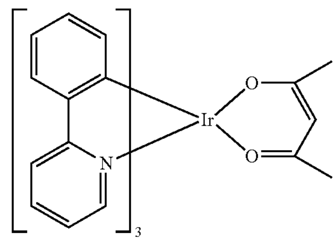
M-b15
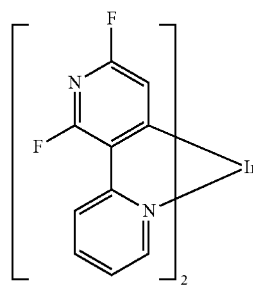

-continued
M-b16
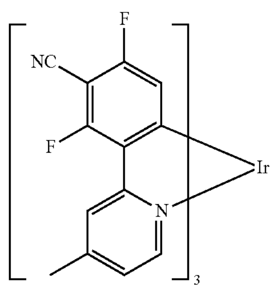
M-b17
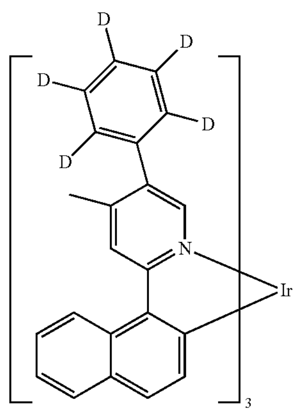
M-b18
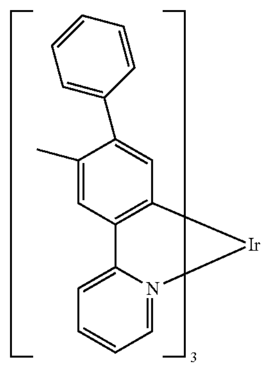
M-b19
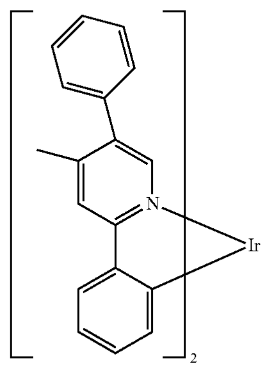
-continued
M-b20
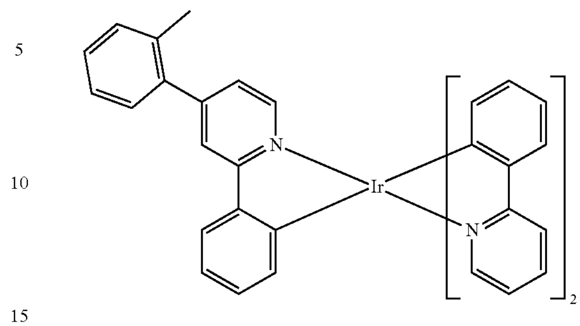
M-b21
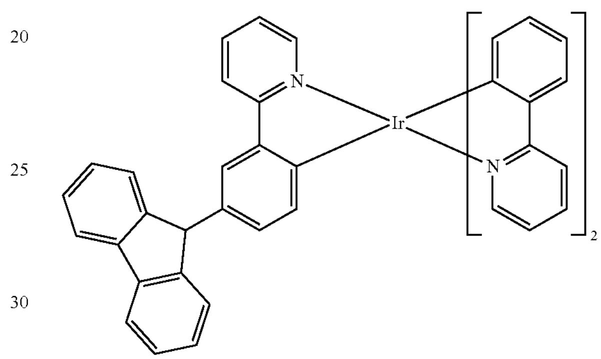
M-b22
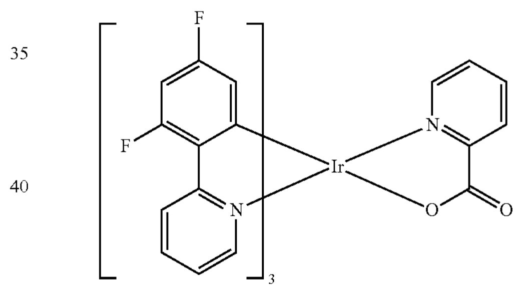
M-b23
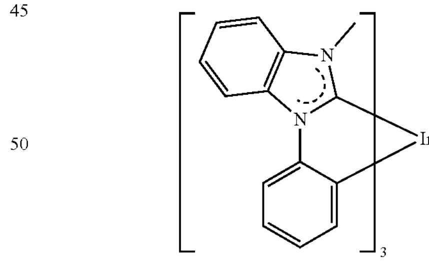
M-b24
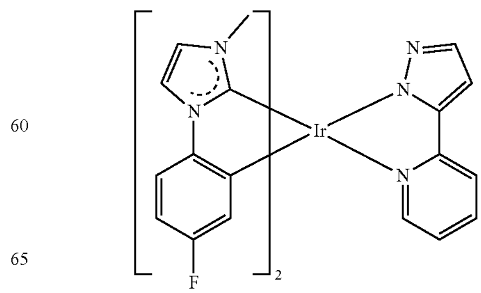

-continued

M-b25

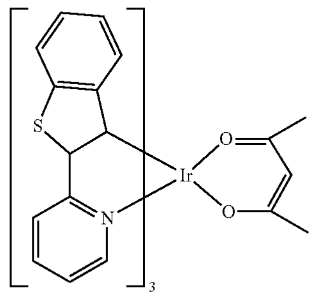

The first stack ST1 may further include a hole transport region HTR that transports, to the first light-emitting layer BEML1, holes provided from the first electrode EL1, and a first intermediate electron transport region that transports, to the first light-emitting layer BEML1, electrons generated from the first charge generation layer CGL1.

The hole transport region HTR may include a hole injection layer HIL disposed on the first electrode EL1, and a hole transport layer HTL disposed on the hole injection layer HIL. The hole transport layer HTL may contact the lower surface of the first light-emitting layer BEML1. However, embodiments are not limited thereto, and the hole transport region HTR may further include a hole-side additional layer disposed on the hole transport layer HTL. The hole-side additional layer may include at least one of a hole buffer layer, a light-emitting auxiliary layer, and an electron blocking layer. The hole buffer layer may be a layer that increases a light emission efficiency by compensating for a resonance distance depending on the wavelength of light emitted from the light-emitting layer. The electron blocking layer may be a layer that serves to prevent electrons from being injected from the electron transport region to the hole transport region.

The first intermediate electron transport region may include a first intermediate electron transport layer METL1 disposed on a (1-1)-st light-emitting layer BEML1. The first intermediate electron transport layer METL1 may be disposed between the (1-1)-st light-emitting layer BEML1 and the first charge generation layer CGL1, and may be in contact with each of the (1-1)-st light-emitting layer BEML1 and the first charge generation layer CGL1. However, embodiments are not limited thereto, and the first intermediate electron transport region may further include a first intermediate electron-side additional layer disposed between the first intermediate electron transport layer METL1 and the (1-1)-st light-emitting layer BEML1. The first intermediate electron-side additional layer may include at least one of an electron buffer layer and a hole blocking layer. A first intermediate electron injection layer may be disposed between the first intermediate electron transport layer METL1 and the first charge generation layer CGL1.

The second stack ST2 may further include a first intermediate hole transport region MHTR1 that transports, to a (1-2)-nd light-emitting layer BEML2, holes generated from the first charge generation layer CGL1, and a second intermediate electron transport region that transports, to the (1-2)-nd light-emitting layer BEML2, electrons provided from the second charge generation layer CGL2.

The first intermediate hole transport region MHTR1 may include a first intermediate hole injection layer MHIL1 disposed on the first charge generation layer CGL1, and a first intermediate hole transport layer MHTL1 disposed on the first intermediate hole injection layer MHIL1. The first intermediate hole transport layer MHTL1 may be in contact with the lower surface of the (1-2)-nd light-emitting layer BEML2. However, embodiments are not limited thereto, and the first intermediate hole transport region MHTR1 may further include a first intermediate hole-side additional layer disposed on the first intermediate hole transport layer MHTL1. The first intermediate hole-side additional layer may include at least one of a hole buffer layer, a light-emitting auxiliary layer, and an electron blocking layer.

The second intermediate electron transport region may include a second intermediate electron transport layer METL2 disposed on the (1-2)-nd light-emitting layer BEML2. The second intermediate electron transport layer METL2 may be disposed between the (1-2)-nd light-emitting layer BEML2 and the second charge generation layer CGL2, and may contact each of the (1-2)-nd light-emitting layer BEML2 and the second charge generation layer CGL2. However, embodiments are not limited thereto, and the second intermediate electron transport region may further include a second intermediate electron-side additional layer disposed between the second intermediate electron transport layer METL2 and the (1-2)-nd light-emitting layer BEML2. The second intermediate electron-side additional layer may include at least one of an electron buffer layer and a hole blocking layer. A second intermediate electron injection layer may be disposed between the second intermediate electron transport layer METL2 and the second charge generation layer CGL2.

The third stack ST3 may further include a second intermediate hole transport region MHTR2 that transports, to a (1-3)-rd light-emitting layer BEML3, holes generated from the second charge generation layer CGL2, and a third intermediate electron transport region that transports, to the (1-3)-rd light-emitting layer BEML3, electrons provided from the third charge generation layer CGL3.

The second intermediate hole transport region MHTR2 may include a second intermediate hole injection layer MHIL2 disposed on the second charge generation layer CGL2 and a second intermediate hole transport layer MHTL2 disposed on the second intermediate hole injection layer MHIL2. The second intermediate hole transport layer MHTL2 may be in contact with the lower surface of the (1-3)-rd light-emitting layer BEML3. However, embodiments are not limited thereto, and the second intermediate hole transport region MHTR2 may further include a second intermediate hole-side additional layer disposed on the second intermediate hole transport layer MHTL2. The second intermediate hole-side additional layer may include at least one of a hole buffer layer, a light-emitting auxiliary layer, and an electron blocking layer.

The third intermediate electron transport region may include a third intermediate electron transport layer METL3 disposed on the (1-3)-rd light-emitting layer BEML3. The third intermediate electron transport layer METL3 may be disposed between the (1-3)-rd light-emitting layer BEML3 and the third charge generation layer CGL3, and may be in contact with each of the (1-3)-rd light-emitting layer BEML3 and the third charge generation layer CGL3. However, embodiments are not limited thereto, and the third intermediate electron transport region may further include a third intermediate electron-side additional layer disposed between the third intermediate electron transport layer METL3 and the (1-3)-rd light-emitting layer BEML3. The third intermediate electron-side additional layer may include at least one of an electron buffer layer and a hole blocking layer. A third intermediate electron injection layer may be disposed between the third intermediate electron transport layer METL3 and the third charge generation layer CGL3.

The fourth stack ST4 may further include a third intermediate hole transport region MHTR3 that transports, to the second light-emitting layer GEML4-1 and GEML4-2, holes generated from the third charge generation layer CGL3, and an electron transport region ETR that transports, to the second light-emitting layer GEML4-1 and GEML4-2, electrons provided from the second electrode EL2.

The third intermediate hole transport region MHTR3 may include a third intermediate hole injection layer MHIL3 disposed on the third charge generation layer CGL3 and a third intermediate hole transport layer MHTL3 disposed on the third intermediate hole injection layer MHIL3. The third intermediate hole transport layer MHTL3 may contact the lower surfaces of the second light-emitting layer GEML4-1 and GEML4-2. However, embodiments are not limited thereto, and the third intermediate hole transport region MHTR3 may further include a third intermediate hole-side additional layer disposed on the third intermediate hole transport layer MHTL3. The third intermediate hole-side additional layer may include at least one of a hole buffer layer, a light-emitting auxiliary layer, and an electron blocking layer.

The electron transport region ETR may include an electron transport layer ETL disposed on the second light-emitting layer GEML4-1 and GEML4-2 and an electron injection layer EIL disposed on the electron transport layer ETL. The electron transport layer ETL may contact the second light-emitting layer GEML4-1 and GEML4-2. However, embodiments are not limited thereto, and the electron transport region ETR may further include an electron-side additional layer disposed between the electron transport layer ETL and the second light-emitting layer GEML4-1 and GEML4-2. The electron-side additional layer may include at least one of an electron buffer layer and a hole blocking layer.

Figure 6B:
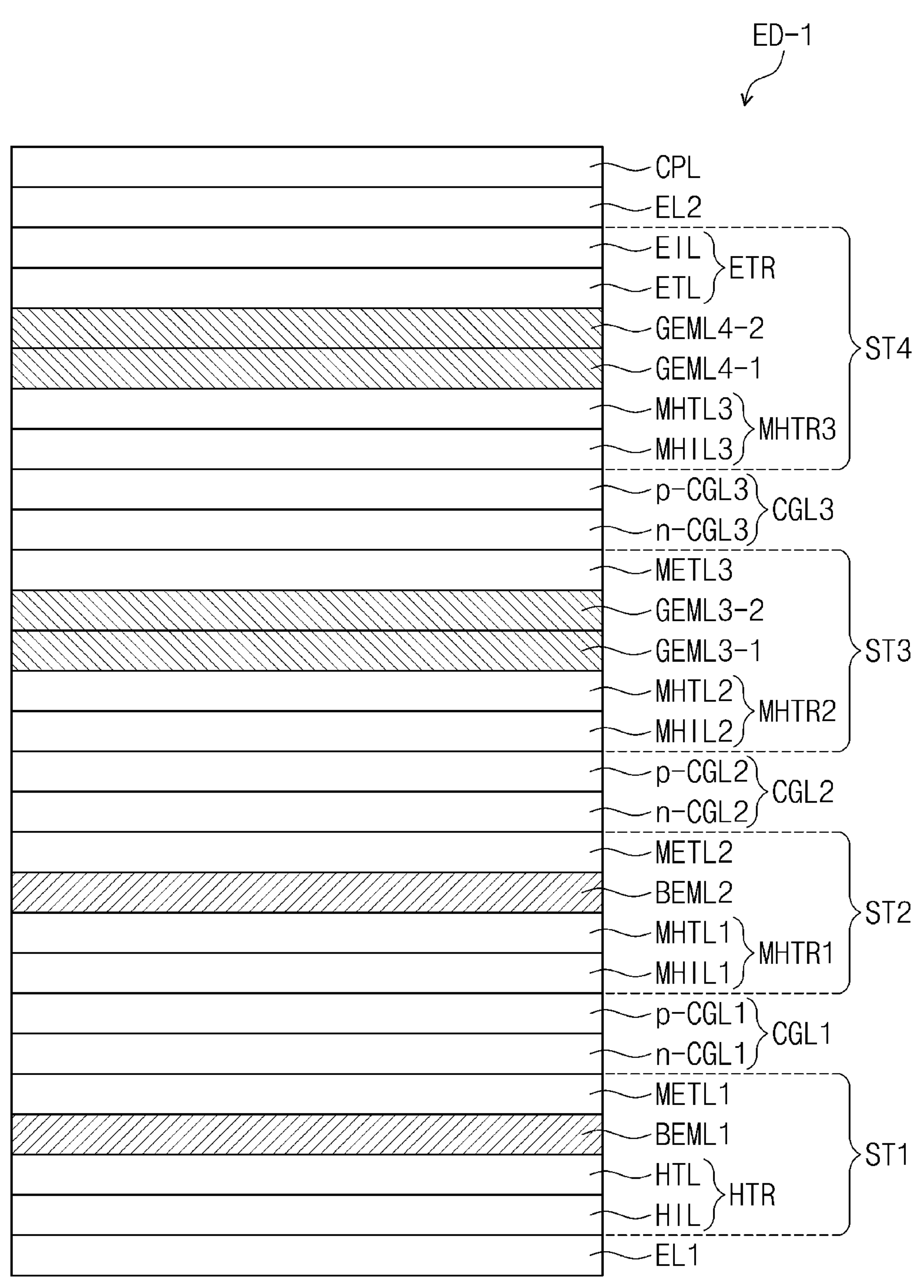

Referring to FIG. 6B, a light-emitting device ED-1 according to an embodiment may include multiple second light-emitting layers GEML3-1, GEML3-2, GEML4-1, and GEML4-2 in comparison to the light-emitting device ED illustrated in FIG. 6A. It is illustrated that all of the second light-emitting layers respectively included in stacks may have a double layer structure. However, one among the third stack ST3 and the fourth stack ST4 may have a double layer structure and the other may have a single layer structure.

Figure 6C:
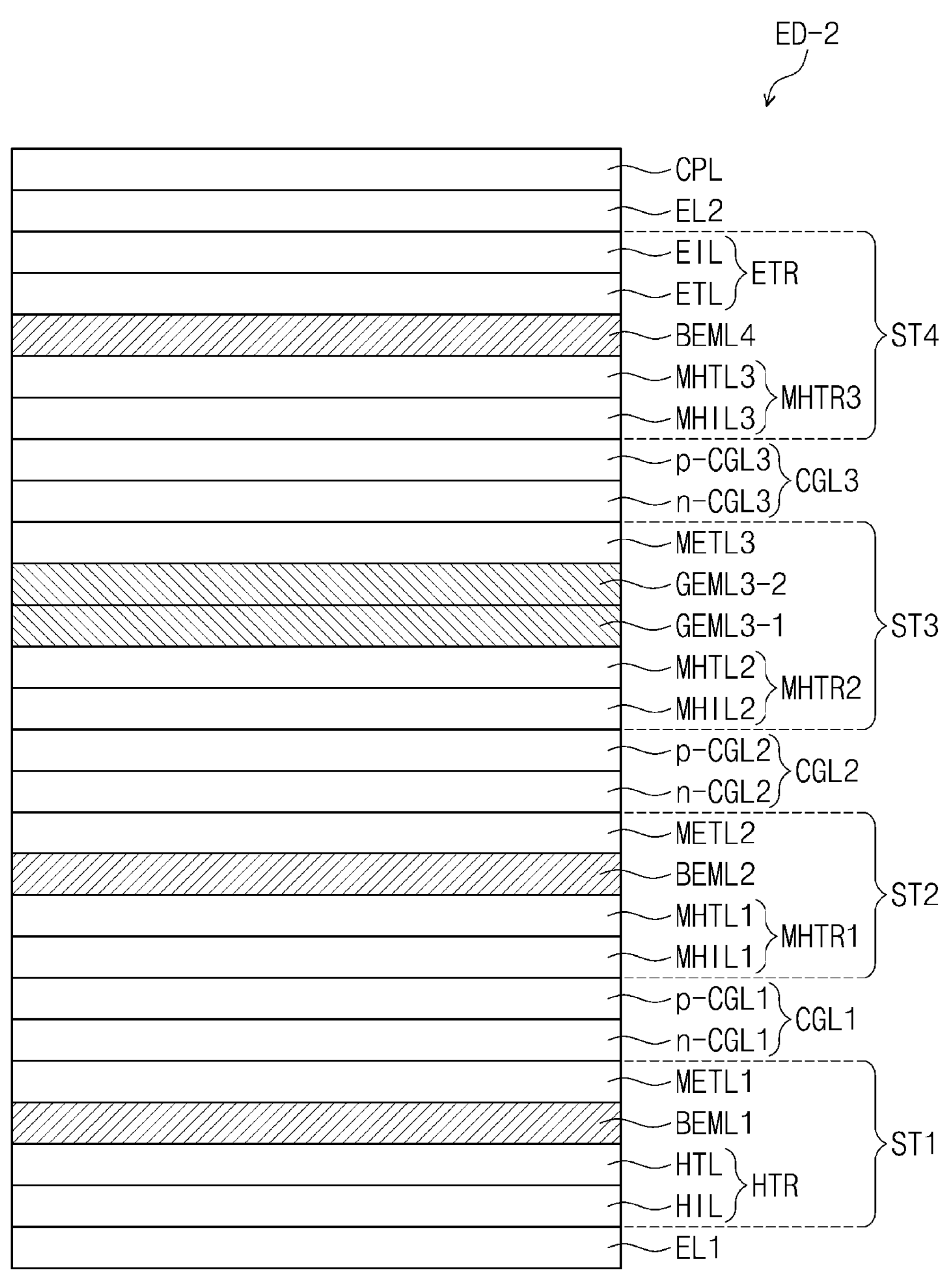
Figure 6D:
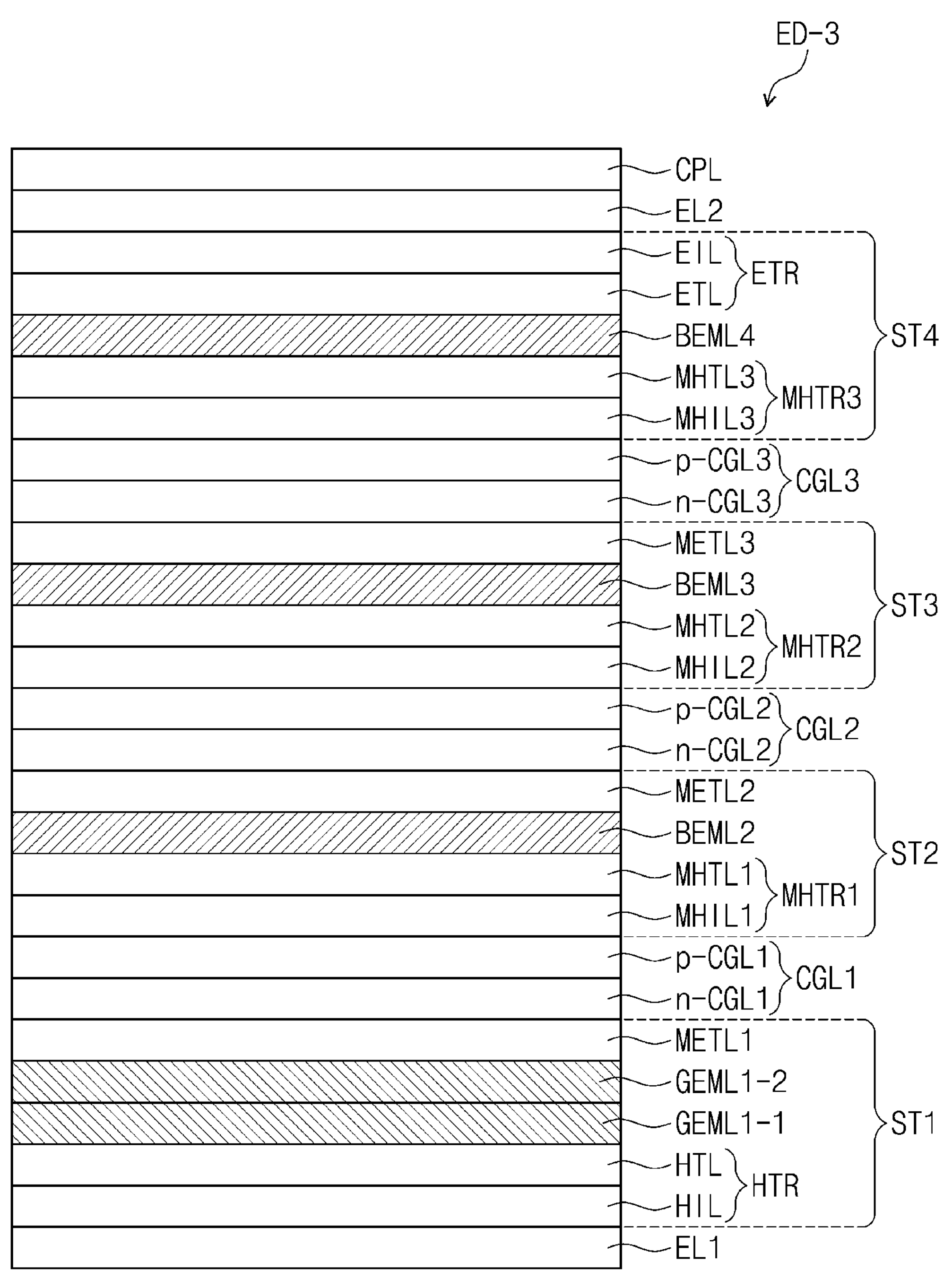

Referring to FIGS. 6C and 6D, in light-emitting devices ED-2 and ED-3 according to embodiments, the second light-emitting layer GEML may not be included in the fourth stack ST4 but may be included in another stack, in comparison to the light-emitting device ED illustrated in FIG. 6A. For example, like a light-emitting device ED-2 according to an embodiment illustrated in FIG. 6C, the light-emitting device may have a structure in which the third stack ST3 may include the second light-emitting layer GEML, and the first stack ST1, the second stack ST2, and the fourth stack ST4 respectively include the first light-emitting layers BEML1, BEML2, and BEML4. In other embodiments, like a light-emitting device ED-3 according to an embodiment illustrated in FIG. 6D, the light-emitting device may have a structure in which the first stack ST1 may include the second light-emitting layer GEML1-1 and GEML1-2, and the second stack ST2, the third stack ST3, and the fourth stack ST4 respectively include the first light-emitting layers BEML2, BEML3, and BEML4. Although not illustrated, the light-emitting device may have a structure in which the second stack ST2 may include the second light-emitting layer GEML, and the remaining first stacks ST1, third stack ST3, and fourth stack ST4 respectively include the first light-emitting layers BEML2, BEML3, and BEML4.

Referring to FIGS. 6A to 6D together, in the light-emitting devices ED, ED-1, ED-2, and ED-3 according to embodiments, the first electrode EL1 may have conductivity. The first electrode EL1 may be formed of a metal material, a metal alloy, a conductive compound, or a combination thereof. The first electrode EL1 may be an anode or a cathode. However, embodiments are not limited thereto. The first electrode EL1 may be a pixel electrode.

In the light-emitting devices ED, ED-1, ED-2, and ED-3 according to embodiments, the first electrode EL1 may be a reflective electrode. For example, the first electrode EL1 may include Ag, Mg, Cu, Al, Pt, Pd, Au, Ni, Nd, Ir, Cr, Li, Ca, LiF/Ca, LiF/Al, Mo, Ti, W, In, Zn, Sn, or a compound or mixture thereof (e.g., a mixture of Ag and Mg) having high reflectance. In other embodiments, the first electrode EL1 may have a multilayer structure including a reflective film formed of the above material and a transparent conductive film formed of indium tin oxide (ITO), indium zinc oxide (IZO), zinc oxide (ZnO), indium tin zinc oxide (ITZO), or the like, or a combination thereof. For example, the first electrode EL1 may have a two-layer structure of ITO/Ag and a three-layer structure of ITO/Ag/ITO. Embodiments are not limited thereto, and the first electrode EL1 may include the above-described metal material, a combination of two or more metal materials selected from among the above-described metal materials, or oxides of the above-described metal materials. The thickness of the first electrode EL1 may be about 70 nm to about 1000 nm. For example, the thickness of the first electrode EL1 may be about 100 nm to about 300 nm.

In the light-emitting devices ED, ED-1, ED-2, and ED-3 according to embodiments, the hole transport region HTR and the intermediate hole transport regions MHTR1, MHTR2, and MHTR3 may have a single layer formed of a single material, a single layer formed of different materials, or a multilayer structure having multiple layers formed of different materials.

The hole transport region HTR and the intermediate hole transport regions MHTR1, MHTR2, and MHTR3 may be respectively formed using various methods such as a vacuum deposition method, a spin coating method, cast method, LB method (Langmuir-Blodgett), inkjet printing method, laser printing method, laser induced thermal imaging (LITI) or the like, or a combination thereof.

The hole transport region HTR and the intermediate hole transport regions MHTR1, MHTR2, and MHTR3 may respectively include a phthalocyanine compound such as copper phthalocyanine, polyetherketone including triphenylamine (TPAPEK), or the like, or a combination thereof.

The hole transport region HTR and the intermediate hole transport regions MHTR1, MHTR2, MHTR3 may respectively include a carbazole derivative such as N-phenylcarbazole and polyvinylcarbazole, a fluorene-based derivative, N,N'-bis(3-methylphenyl)-N,N'-diphenyl-[1,1'-biphenyl]-4,4'-diamine (TPD), a triphenylamine derivative such as 4,4',4"-tris(N-carbazolyl)triphenylamine (TCTA), 1,3-bis(N-carbazolyl)benzene (mCP), or the like, or a combination thereof.

The hole transport region HTR and the intermediate hole transport regions MHTR1, MHTR2, MHTR3 may respectively include 9-(4-tert-butylphenyl)-3,6-bis(triphenylsilyl)-9H-carbazole) (CzSi), 9-phenyl-9H-3,9'-bicarbazole (CCP), 1,3-bis(1,8-dimethyl-9H-carbazol-9-yl)benzene (mDCP), or the like, or a combination thereof.

The hole transport region HTR may include the above-described compounds of the hole transport region, in at least one of the hole injection layer HIL, the hole transport layer HTL, and the hole-side additional layer. The intermediate hole transport regions MHTR1, MHTR2, and MHTR3 may include the compounds of the above-described hole transport region, in at least one of intermediate hole injection layers MHIL1, MHIL2, and MHIL3, intermediate hole transport layers MHTL1, MHTL2, and MHTL3, and the intermediate hole-side additional layer.

The hole transport region HTR and the intermediate hole transport regions MHTR1, MHTR2, and MHTR3 may each have a thickness of about 10 nm to about 1,000 nm, for example, about 10 nm to about 500 nm. The hole injection layer HIL and the intermediate hole injection layers MHIL1, MHIL2, and MHIL3 may each have a thickness of, for example, about 5 nm to about 100 nm. The hole transport layer HTL and the intermediate hole transport layers MHTL1, MHTL2, and MHTL3 may each have a thickness of about 5 nm to about 100 nm. In case that the hole transport region HTR includes the hole-side additional layer, the hole-side additional layer may have a thickness of about 1 nm to about 100 nm. In case that the intermediate hole transport regions MHTR1, MHTR2, and MHTR3 include the intermediate hole-side additional layer, the intermediate hole-side additional layer may have a thickness of about 1 nm to about 100 nm. In case that the thicknesses of the hole transport region HTR and the intermediate hole transport regions MHTR1, MHTR2, and MHTR3 and each layer included therein satisfy the above-described ranges, satisfactory hole transport characteristics may be obtained without a substantial increase in driving voltage.

The hole transport region HTR and the intermediate hole transport regions MHTR1, MHTR2, and MHTR3 may further respectively include a charge generating material to improve conductivity, in addition to the above-described materials. The charge generating material may be uniformly or non-uniformly dispersed in the hole transport region HTR and the intermediate hole transport regions MHTR1, MHTR2, and MHTR3. The charge generating material may be, for example, a p-type dopant. The p-type dopant may include at least one of a metal halide compound, a quinone derivative, a metal oxide, and a cyano group-containing compound, but is not limited thereto. For example, the p-type dopant may include a metal halide compound such as CuI and RbI, a quinone derivative such as tetracyanoquinodimethane (TCNQ) and 2,3,5,6-tetrafluoro-7,7',8,8-tetracyanoquinodimethane (F4-TCNQ), a metal oxide such as tungsten oxide and molybdenum oxide, or the like, or a combination thereof, but embodiments are not limited thereto.

The first light-emitting layers BEML1, BEML2, and BEML3 and the second light-emitting layer GEML may be provided on the hole transport region HTR or the intermediate hole transport regions MHTR1, MHTR2, and MHTR3. The (1-1)-st light-emitting layer BEML1 may be provided on the hole transport region HTR, the (1-2)-nd light-emitting layer BEML2 may be provided on the first intermediate hole transport region MHTR1, the (1-3)-rd light-emitting layer BEML3 may be provided on the second intermediate hole transport region MHTR2, and the second light-emitting layer GEML may be provided on the third intermediate hole transport region MHTR3.

The electron transport region ETR and the intermediate electron transport regions may be respectively disposed on the first light-emitting layer BEML1, BEML2, and BEML3 and the second light-emitting layer GEML. The electron transport region ETR and each of the intermediate electron transport regions may have a single layer formed of a single material, a single layer formed of different materials, or a multilayer structure having multiple layers formed of different materials.

The electron transport region ETR and each of the intermediate electron transport regions may be formed using various methods such as a vacuum evaporation method, a spin coating method, a cast method, a LB method (Langmuir-Blodgett), an inkjet printing method, a laser printing method, a laser induced thermal imaging (LITI), or a combination thereof.

The electron transport region ETR and each of the intermediate electron transport regions may include an anthracene-based compound. However, embodiments are not limited thereto, and the electron transport region ETR and each of the intermediate electron transport regions may include, for example, tris(8-hydroxyquinolinato)aluminum ($Alq_3$), berylliumbis(benzoquinolin-10-olate) ($Bebq_2$), 9,10-di (naphthalene-2-yl) anthracene (ADN), 1,3-bis[3,5-di(pyridin-3-yl)phenyl]benzene (BmPyPhB), or a mixture thereof.

The electron transport region ETR and each of the intermediate electron transport regions may include a metal halide such as NaCl, CsF, RbCl, RbI, CuI, and KI, a lanthanum group metal such as Yb, a co-deposition material of the above-described metal halide and lanthanum group metal, or a combination thereof. For example, the electron transport region ETR and the intermediate electron transport region may include KI:Yb, RbI:Yb, or the like as a co-deposition material. In the electron transport region ETR and the intermediate electron transport region, a metal oxide such as $Li_2O$ and BaO, or 8-hydroxyl-lithium quinolate (Liq) may be used, but embodiments are not limited thereto. The electron transport region ETR and each of the intermediate electron transport regions may also be formed of a material in which an electron transport material and an insulating organo metal salt may be mixed. The organo metal salt may be a material having an energy band gap of about 4 eV or more. Specifically, for example, the organo metal salt may include metal acetate, metal benzoate, metal acetoacetate, metal acetylacetonate, metal stearate, or a combination thereof.

The electron transport region ETR and each of the intermediate electron transport regions may further include at least one of 2,9-dimethyl-4,7-diphenyl-1,10-phenanthroline (BCP) and 4,7-diphenyl-1,10-phenanthroline (Bphen) in addition to the above-described materials, but embodiments are not limited thereto.

The electron transport region ETR may include the above-described electron transport region compounds, in the electron injection layer EIL or the electron transport layer ETL. In case that the electron transport region ETR includes the electron-side additional layer, the above-described material may be included in the electron-side additional layer. The intermediate electron transport region may include the above-described electron transport region compounds, in the intermediate electron transport layers METL1, METL2, and METL3. The intermediate electron transport region may include the above-described electron transport region compounds, in the intermediate electron-side additional layer or the intermediate electron injection layer.

The electron transport region ETR and the intermediate electron transport region may each have a thickness of, for example, about 100 nm to about 150 nm. The thickness of the electron transport layer ETL may be about 0.1 nm to about 100 nm, for example, about 0.3 nm to about 50 nm. In case that the thickness of the electron transport layer ETL satisfies the above-described range, satisfactory electron transport characteristics may be obtained without a substantial increase in driving voltage. The electron injection layer EIL may have a thickness of about 0.1 nm to about 10 nm, or about 0.3 nm to about 9 nm. In case that the thickness of the electron injection layer EIL satisfies the above-described range, satisfactory electron injection characteristics may be obtained without a substantial increase in driving voltage. The electron transport layers METL1, METL2, and METL3 included in the intermediate electron transport region may each have a thickness of about 0.1 nm to about 100 nm, for example, about 0.1 nm to about 50 nm.

The second electrode EL2 may be provided on the electron transport region ETR. The second electrode EL2 may be a common electrode. The second electrode EL2 may be a cathode or an anode, but the embodiment is not limited thereto. For example, in case that the first electrode EL1 is the anode, the second electrode EL2 may be the cathode; and in case that the first electrode EL1 is the cathode, the second electrode EL2 may be the anode.

The second electrode EL2 may be a transflective electrode or a transmission electrode. In case that the second electrode EL2 is a transmission electrode, the second electrode EL2 may be formed of a transparent metal oxide, for example, indium tin oxide (ITO), indium zinc oxide (IZO), zinc oxide (ZnO), indium tin zinc oxide (ITZO), or a combination thereof.

In case that the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, In, Zn, Sn, or a compound or mixture thereof (e.g., AgMg, AgYb, or MgAg). In other embodiments, the second electrode EL2 may have a multilayer structure including a reflective or semi-transmission film formed of the above material and a transparent conductive film formed of indium tin oxide (ITO), indium zinc oxide (IZO), zinc oxide (ZnO), indium tin zinc oxide (ITZO), or the like. For example, the second electrode EL2 may include the above-described metal material, a combination of two or more metal materials selected from among the above-described metal materials, or oxides of the above-described metal materials.

Although not illustrated, the second electrode EL2 may be connected to the auxiliary electrode. In case that the second electrode EL2 is connected to the auxiliary electrode, the resistance of the second electrode EL2 may be reduced.

A capping layer CPL may be further disposed on the second electrode EL2 of each of the light-emitting devices ED, ED-1, ED-2, and ED-3 according to embodiments. The capping layer CPL may include a multilayer or a single layer.

In an embodiment, the capping layer CPL may be an organic layer or an inorganic layer. For example, in case that the capping layer CPL includes an inorganic material, the inorganic material may include an alkali metal compound such as LiF, an alkaline earth metal compound such as $MgF_2$, SiON, $SiN_X$, SiOy, or the like, or a combination thereof.

For example, in case that the capping layer CPL contains an organic material, the organic material may include α-NPD, NPB, TPD, m-MTDATA, $Alq_3$, CuPc, N4,N4,N4',N4'-tetra (biphenyl-4-yl) biphenyl-4,4'-diamine (TPD15), 4,4',4"-tris(carbazol sol-9-yl) triphenylamine (TCTA), or the like, or may include an epoxy resin, or an acrylate such as a methacrylate, or a combination thereof. However, embodiments are not limited thereto, and the capping layer CPL may include at least one among compounds P1 to P5 below.

P1

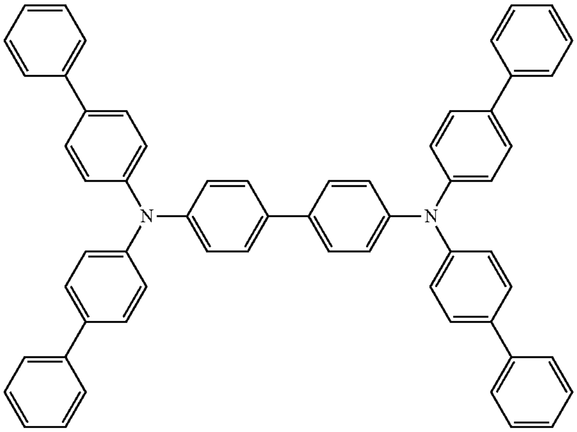

P2

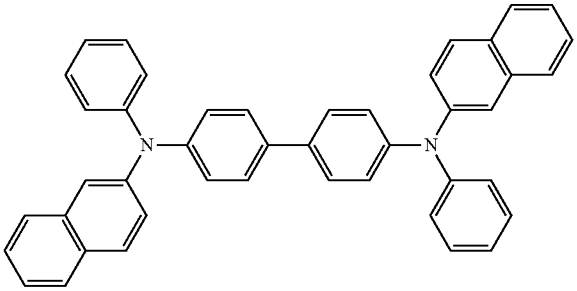

P3

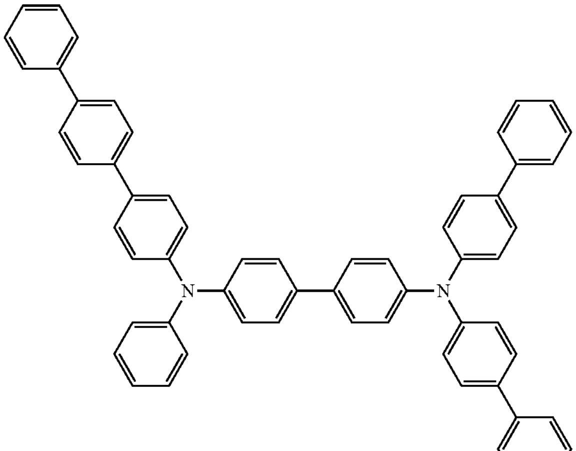

P4

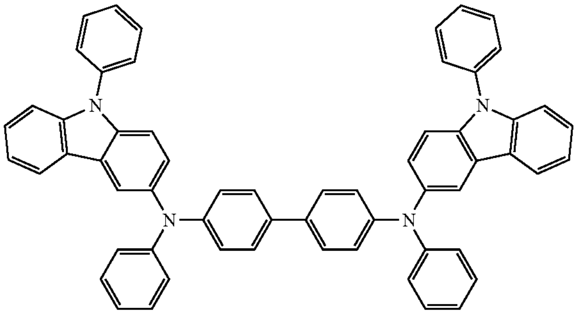

-continued

P5

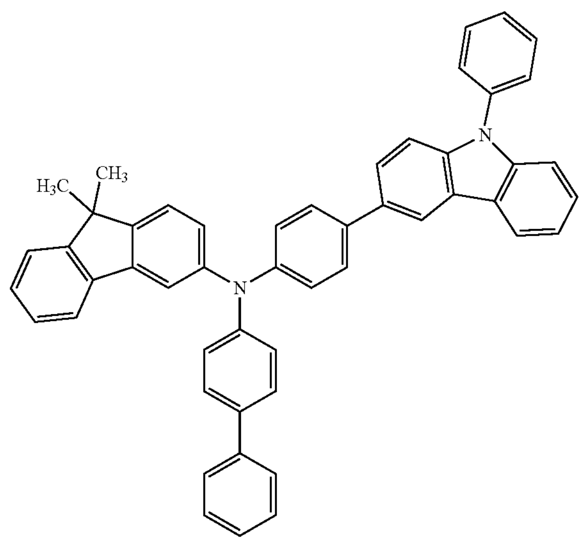

The refractive index of the capping layer CPL may be about 1.6 or more. Specifically, the capping layer CPL may have a refractive index of about 1.6 or more for light in a wavelength range of about 550 nm to about 660 nm.

A light-emitting device according to an embodiment may include a first light-emitting layer emitting light in a wavelength range of about 420 nm to about 480 nm and a second light-emitting layer emitting light in a wavelength range of about 520 nm to about 600 nm, wherein the first light-emitting layer has a single layer structure, and the second light-emitting layer has a double layer structure in which the first sub light-emitting layer may include the hole-transporting host and the first dopant, and the second sub light-emitting layer may include the electron-transporting host and the second dopant. The first sub light-emitting layer may have a small HOMO energy level between the host and the dopant, so that it may be possible to prevent or reduce hole trapping by the dopant. Accordingly, the holes may be smoothly injected into the light-emitting layer, thereby improving the driving voltage. It may be possible to prevent the decrease in an efficiency due to triplet-triplet annihilation (TTA). Accordingly, in the display device according to an embodiment of the disclosure, display efficiency and device lifetime may be improved.

Hereinafter, characteristics evaluation results of a light-emitting device according to an embodiment will be described with reference to Example and Comparative Examples. Example illustrated below is merely an example to aid understanding of the disclosure, and the scope of the disclosure is not limited thereto.

(Manufacture and Evaluation of Light-Emitting Device)

In Example and Comparative Examples 3 and 4 below, as illustrated in FIG. 6A, a tandem light-emitting device was manufactured in which the first stack, the second stack, and the third stack including the first light-emitting layer emitting light in a wavelength range of about 420 nm to about 480 nm were stacked on each other, and the fourth stack including the second light-emitting layer emitting light in a wavelength range of about 520 nm to about 600 nm were stacked on the third stack. The second light-emitting layer may include a first sub light-emitting layer GEML4-1 and a second sub light-emitting layer GEML4-2. Comparative Examples 1 and 2 may be the same as that of Example except at least that the second light-emitting layer GEML4 may be formed of a single layer.

Materials included in the second light-emitting layer of Example and Comparative Examples are shown in Table 1. The first dopant may be M-a-18, and the second dopant may be M-b13. In Table 1 below, ΔE means the absolute value of the difference between the HOMO energy level of a host and the HOMO energy level of a dopant.

TABLE 1

| | GEML | Host | Dopant (doping %) | ΔE |
|---|---|---|---|---|
| Comparative Example 1 | GEML4 | electron-transporting host | second dopant (9%) | 0.1~0.3 |
| Comparative Example 2 | GEML4 | hole-transporting host | first dopant (4%) | 0.1~0.2 |
| Example | GEML4-1 | hole-transporting host | first dopant (4%) | 0.1~0.2 |
| | GEML4-2 | electron-transporting host | second dopant (9%) | 0.1~0.3 |
| Comparative Example 3 | GEML4-1 | electron-transporting host | second dopant (9%) | 0.1~0.3 |
| | GEML4-2 | hole-transporting host | first dopant (4%) | 0.1~0.2 |
| Comparative Example 4 | GEML4-1 | electron-transporting host | second dopant (9%) | 0.1~0.3 |
| | GEML4-2 | hole-transporting host | first dopant (6%) | 0.1~0.2 |

The evaluation results of Example and Comparative Examples are shown in Table 2 below. In the evaluation of the light-emitting device of Table 2, the driving voltage represents a voltage value corresponding to a luminance of about 3500 nits. The device lifetime may be obtained by measuring a time taken for the luminance of the light-emitting device to drop to 97% of the initial luminance. The driving voltage, the luminous efficiency, and the device lifetime may be relative comparative values, based on the luminous efficiency at the driving voltage and luminance of about 100 nits of Comparative Example 1.

TABLE 2

| | Driving voltage @ 100 nt (V) | Efficiency @ 100 nit (Cd/A) | Efficiency @ 1000 nit (Cd/A) | Efficiency @ 10000 nit (Cd/A) | Lifetime @ 10000 nit (T95) |
|---|---|---|---|---|---|
| Comparative Example 1 | 100% | 100% | 91% | 75% | 400 h |
| Comparative Example 2 | 93% | 95% | 90% | 80% | 350 h |
| Example | 97% | 100% | 99% | 97% | 750 h |
| Comparative Example 3 | 110% | 100% | 92% | 78% | 450 h |
| Comparative Example 4 | 115% | 98% | 88% | 76% | 430 h |

Referring to the results in Table 2, it may be confirmed that the light-emitting device of Example has similar or lower driving voltages than the light-emitting devices of Comparative Examples, and that the luminous efficiency and device lifetime may be increased. In the light-emitting device of Example, the difference between the efficiency at the luminance of about 100 nits and the efficiency at the luminance of about 10000 nits is not great, so that the roll-off phenomenon may be reduced. Therefore, it may be confirmed that the light-emitting device of Example has improved efficiency such that a decrease in initial low luminance efficiency may be minimized even in case that the luminance becomes higher, compared to the light-emitting devices of Comparative Examples.

According to an embodiment of the disclosure, it may be possible to provide a light-emitting device and a display apparatus having a luminous efficiency maximized by preventing the occurrence of roll-off of the light-emitting layer in the light-emitting device, and having an improved luminous efficiency and device lifetime.

Although embodiments have been described, it is understood that the disclosure should not be limited to these embodiments but various changes and modifications can be made by one ordinary skilled in the art within the spirit and scope of the disclosure.

What is claimed is:

1. A light-emitting device comprising:

a first electrode;

a hole transport region disposed on the first electrode;

a first light-emitting layer disposed on the hole transport region and emitting light of a first wavelength;

a second light-emitting layer disposed on the hole transport region and being for emitting light of a second wavelength different from the first wavelength;

an electron transport region disposed on the first light-emitting layer and the second light-emitting layer; and a second electrode disposed on the electron transport region, wherein the second light-emitting layer includes:

a first sub light-emitting layer including a first host and a first dopant and emitting the light of the second wavelength; and a second sub light-emitting layer including a second host different from the first host and a second dopant and being for emitting the light of the second wavelength, the first sub light-emitting layer contacting the second sub light-emitting layer.

2. The light-emitting device of claim 1, wherein the first wavelength is about 420 nm to about 480 nm, and the second wavelength is about 520 nm to about 600 nm.

3. The light-emitting device of claim 1, further comprising:

a charge generation layer disposed between the first light-emitting layer and the second light-emitting layer.

4. The light-emitting device of claim 3, wherein the charge generation layer comprises:

a p-type charge generation layer doped with p-dopants; and an n-type charge generation layer doped with n-dopants.

5. The light-emitting device of claim 1, further comprising:

a first additional light-emitting layer disposed between the hole transport region and the electron transport region and being for emitting the light of the first wavelength.

6. The light-emitting device of claim 5, further comprising:

a second additional light-emitting layer disposed between the first light-emitting layer and the second light-emitting layer and being for emitting the light of the first wavelength.

7. The light-emitting device of claim 1, wherein the first dopant includes an organometallic compound having a central metal of platinum (Pt).

8. The light-emitting device of claim 7, wherein the first dopant is represented by Formula M-a below:

[Formula M-a]

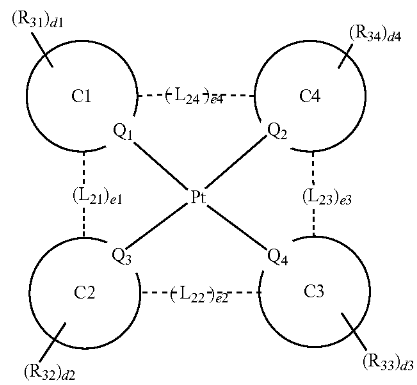

in Formula M-a, $Q_1$ to $Q_4$ are each independently C or N, rings C1 to C4 are each independently a substituted or unsubstituted hydrocarbon ring having 5 to 30 ring-forming carbon atoms or a substituted or unsubstituted heterocycle having 2 to 30 ring-forming carbon atoms, $L_{21}$ to $L_{24}$ are each independently a direct linkage,

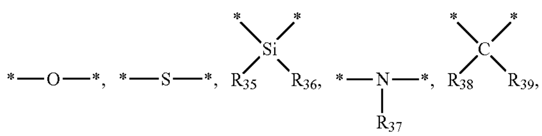

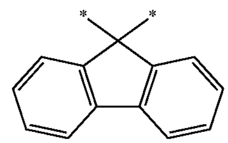

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, e1 to e4 are each independently 0 or 1, $R_{31}$ to $R_{39}$ are each independently a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, and d1 to d4 are each independently an integer of 0 to 4.

9. The light-emitting device of claim 1, wherein the second dopant includes an organometallic compound having a central metal of iridium (Ir).

10. The light-emitting device of claim 9, wherein the second dopant is represented by Formula M-b:

[Formula M-b]

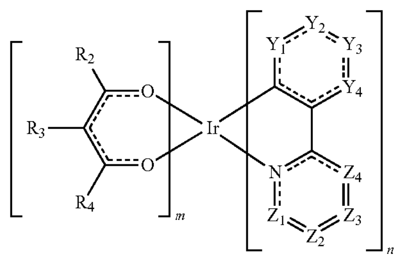

in Formula M-b, $Y_1$ to $Y_4$, and $Z_1$ to $Z_4$ are each independently $CR_1$ or N, $R_1$ to $R_4$ are each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or are bonded to an adjacent group to form a ring, m is 0 or 1, n is 2 or 3, in case that m is 0, n is 3, and in case that m is 1, n is 2.

11. The light-emitting device of claim 1, wherein the hole transport region comprises:

a hole injection layer disposed on the first electrode; and a hole transport layer disposed on the hole injection layer, and the electron transport region includes:

an electron transport layer disposed on the first light-emitting layer and the second light-emitting layer; and an electron injection layer disposed on the electron transport layer.

12. The light-emitting device of claim 1, further comprising:

a capping layer disposed on the second electrode, wherein the capping layer has a refractive index of about 1.6 or more.

13. The light-emitting device of claim 4, further comprising:

an intermediate electron transport layer disposed between the first light-emitting layer and the charge generation layer; and an intermediate hole transport layer disposed between the charge generation layer and the second light-emitting layer.

14. A display apparatus comprising:

a display panel including:

a first pixel region being for emitting light of a first wavelength;

a second pixel region being for emitting light of a second wavelength different from the first wavelength;

a third pixel region being for emitting light of a third wavelength different from the first wavelength and the second wavelength; and a light-emitting device overlapping the first to third pixel regions in a plan view; and a light control layer including:

a first light control part disposed on the display panel and overlapping the first pixel region in the plan view;

a second light control part overlapping the second pixel region in the plan view; and a third light control part overlapping the third pixel region in the plan view, wherein the light-emitting device includes:

a first electrode;

a hole transport region disposed on the first electrode;

a first light-emitting layer disposed on the hole transport region and being for emitting the light of the first wavelength;

a second light-emitting layer disposed on the hole transport region and being for emitting the light of the second wavelength;

an electron transport region disposed on the first light-emitting layer and the second light-emitting layer; and a second electrode disposed on the electron transport region, the second light-emitting layer includes a first sub light-emitting layer including a first host and a first dopant and being configured to emit the light of the second wavelength, and a second sub light-emitting layer includes a second host different from the first host and a second dopant and being configured to emit the light of the second wavelength, the first sub light-emitting layer contacting the second sub light-emitting layer.

15. The display apparatus of claim 14, wherein the first wavelength is about 420 nm to about 480 nm, and the second wavelength is about 520 nm to about 600 nm.

16. The display apparatus of claim 14, wherein the second light control part comprises quantum dots that convert the light of the first wavelength into the light of the second wavelength, and the third light control part comprises quantum dots that convert light of the first wavelength or light of the second wavelength into the light of the third wavelength.

17. The display apparatus of claim 14, further comprising:

a color filter layer disposed on the light control layer.

* * * * *